United States Patent
Simpson et al.

(10) Patent No.: US 9,201,302 B2
(45) Date of Patent: Dec. 1, 2015

(54) NEGATIVE-WORKING LITHOGRAPHIC PRINTING PLATE PRECURSOR

(71) Applicants: Christopher D. Simpson, Osterode (DE); Harald Baumann, Osterode (DE); Udo Dwars, Herzberg (DE); Michael Flugel, Osterode (DE)

(72) Inventors: Christopher D. Simpson, Osterode (DE); Harald Baumann, Osterode (DE); Udo Dwars, Herzberg (DE); Michael Flugel, Osterode (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 61 days.

(21) Appl. No.: 14/044,912

(22) Filed: Oct. 3, 2013

(65) Prior Publication Data

US 2015/0099229 A1 Apr. 9, 2015

(51) Int. Cl.
| | |
|---|---|
| *G03F 7/00* | (2006.01) |
| *G03F 7/033* | (2006.01) |
| *G03F 7/20* | (2006.01) |
| *G03F 7/038* | (2006.01) |
| *B41C 1/10* | (2006.01) |

(52) U.S. Cl.
CPC .............. *G03F 7/033* (2013.01); *B41C 1/1008* (2013.01); *G03F 7/0388* (2013.01); *G03F 7/20* (2013.01); *B41C 2210/04* (2013.01); *B41C 2210/06* (2013.01); *B41C 2210/24* (2013.01)

(58) Field of Classification Search
CPC .............................. B41C 2210/04; G03F 7/033
USPC ................................................. 430/270.1, 302
See application file for complete search history.

(56) References Cited

U.S. PATENT DOCUMENTS

| | | | |
|---|---|---|---|
| 7,052,822 | B2 | 5/2006 | Goto |
| 7,144,661 | B1 | 12/2006 | Ray et al. |
| 7,300,726 | B1 | 11/2007 | Patel et al. |
| 7,332,253 | B1 | 2/2008 | Tao et al. |
| 8,137,891 | B2 | 3/2012 | Jarek et al. |
| 2010/0028806 | A1 | 2/2010 | Patel et al. |
| 2014/0134540 | A1 | 5/2014 | Taguchi et al. |

FOREIGN PATENT DOCUMENTS

| | | |
|---|---|---|
| EP | 1 505 441 A2 | 2/2005 |
| EP | 1505441 A2 * | 2/2005 |
| EP | 1 849 600 A1 | 10/2007 |
| EP | 1849600 A1 * | 10/2007 |

* cited by examiner

*Primary Examiner* — Chanceity Robinson
(74) *Attorney, Agent, or Firm* — J. Lanny Tucker

(57) ABSTRACT

Negative-working lithographic printing plate precursors have improved bakeability and good shelf life and can be imaged using either UV or infrared radiation. These precursors have a negative-working imageable layer that has a unique polymeric binder comprising a polymeric backbone and further comprising at least (a) and (b) pendant groups distributed in random order along the polymeric backbone. The (a) pendant groups are ethylenically unsaturated polymerizable groups, and the (b) pendant groups are defined by Structures (I), (II), and (III) described in the disclosure.

19 Claims, No Drawings

NEGATIVE-WORKING LITHOGRAPHIC PRINTING PLATE PRECURSOR

FIELD OF THE INVENTION

This invention relates to negative-working lithographic printing plate precursors. This invention also provides a method for imaging and processing these negative-working lithographic printing plate precursors to provide lithographic printing plates that exhibit improved printing run length because of a unique polymeric binder in the precursor imageable layer

BACKGROUND OF THE INVENTION

In lithographic printing, lithographic ink receptive regions, known as image areas, are generated on a hydrophilic surface. When the surface is moistened with water and lithographic ink is applied, the hydrophilic regions retain the water and repel the lithographic ink and the lithographic ink receptive regions accept the lithographic ink and repel the water. The lithographic ink is then transferred to the surface of suitable materials upon which the image is to be reproduced. In some instances, the lithographic ink can be first transferred to an intermediate blanket that in turn is used to transfer the lithographic ink to the surface of the materials upon which the image is to be reproduced.

Lithographic printing plate precursors useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working. Conversely, if the non-exposed regions are removed, the element is considered as negative-working. In each instance, the regions of the imageable layer(s) that remain are lithographic ink-receptive, and the regions of the hydrophilic surface revealed by the developing process accept water or aqueous solutions (typically a fountain solution), and repel lithographic ink.

"Laser direct imaging" methods (LDI) are used to directly form an offset printing plate or printing circuit board using digital data from a computer, and provide numerous advantages over the previous processes using masking photographic films. There has been considerable development in this field from more efficient lasers, improved imageable compositions and components thereof.

Various radiation-sensitive compositions are used in negative-working lithographic printing plate precursors as described for example in U.S. Pat. No. 6,309,792 (Hauck et al.), U.S. Pat. No. 6,893,797 (Munnelly et al.), U.S. Pat. No. 6,727,281 (Tao et al.), U.S. Pat. No. 6,899,994 (Huang et al.), U.S. Pat. No. 6,919,411 (Fujimako et al.), U.S. Pat. No. 8,137,896 (Patel et al.), and U.S. Pat. No. 7,429,445 (Munnelly et al.), U.S. Patent Application Publications 2002/0168494 (Nagata et al.), 2003/0118939 (West et al.), and EP Publications 1,079,276A2 (Lifka et al.) and 1,449,650A2 (Goto et al.). Many other publications provide details about such negative-working radiation-sensitive compositions comprising necessary imaging chemistry dispersed within suitable polymeric binders.

After imaging, the negative-working lithographic printing plate precursors are developed (processed) to remove the non-imaged (non-exposed) regions of the imageable layer.

In recent years, offset lithographic printing plates have had to meet ever growing demands for resistance to solvents and common press room chemicals such as plate cleansers or blanket wash solutions and alcohol substitutes in the fountain solution. In particular, when printing with UV-curing inks, where washing solutions with a high ester, ether, or ketone content are used, the chemical resistance of conventional lithographic printing plates, especially negative-working lithographic printing plates, is no longer sufficient unless they are subjected to special stabilizing processes.

It is also desired that the lithographic printing plates exhibit high abrasion resistance along with the improved chemical resistance. It is not always possible to achieve both properties with the same chemical compositions. What may improve abrasion resistance may not affect chemical resistance. In addition, the features that may improve chemical resistance may diminish imaging sensitivity. The desired chemical resistance can also be increased by baking the imaged and processed lithographic printing plates. However, not all imaging formulations are suitably baked to provide chemical resistance.

U.S. Pat. No. 8,137,891 (Jarek et al.) describes unique polymeric binders that can be used in both negative-working and positive-working lithographic printing plate precursors to improve bakeability and thus chemical resistance. However, there is a need to increase the photospeed to meet the needs of lithographic printing customers.

Thus, while previous research and development of chemically resistant polymer binders for lithographic printing plate precursors has provided some improvement, the technology has room for further improvement. While known polymeric binders have provided improved chemical resistance, there is a desire to provide even more improvement in bakeability so as to provide higher processing speeds, good shelf life, and run length.

SUMMARY OF THE INVENTION

The present invention provides an improvement with a negative-working lithographic printing plate precursor comprising a substrate and having thereon a negative-working imageable layer comprising:

a free radically polymerizable component, an initiator composition capable of generating free radicals upon exposure to radiation, a radiation absorber, and a polymeric binder comprising a polymeric backbone and further comprising at least (a) and (b) pendant groups distributed in random order along the polymeric backbone, the (a) and (b) pendant groups being identified as follows:

(a) pendant groups comprising ethylenically unsaturated polymerizable groups, and (b) pendant groups comprising one or more groups represented by following Structures (1), (II), and (III):

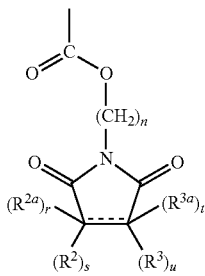

(II)

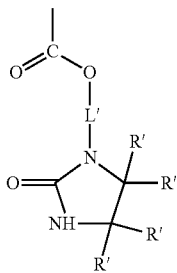

(III)

wherein:

each R' is independently hydrogen, or a substituted or unsubstituted alkyl or a substituted or unsubstituted aryl group, $R^2$, $R^{2a}$, $R^3$, and $R^{3a}$ are independently hydrogen or a substituted or unsubstituted alkyl group, or $R^2$ and $R^3$ or $R^{2a}$ and $R^{3a}$, together with the two carbon atoms to which they are bonded, form a substituted or unsubstituted aryl group, substituted or unsubstituted heteroaryl group, or a substituted or unsubstituted carbocyclic or heterocyclic group, $R^4$ is hydrogen or a substituted or unsubstituted alkyl group, L and L' are independently divalent substituted or unsubstituted linking groups, n is 0 or 1, r, s, t, and u are independently 0 or 1 provided that one of r and s is 0 if the carbon atom to which $R^2$ and $R^{2a}$ are bonded is part of —C=C— double bond, and further provided that one of t and u is 0 if the carbon atom to which $R^3$ and $R^{3a}$ are bonded is part of a —C=C— double bond, and the dotted line in Structure II indicates that a double bond may or may not be present, wherein the (a) pendant groups are present in an amount of at least 0.5 mmol/g of the polymeric binder and up to and including 7 mmol/g of the polymeric binder and the (b) pendant groups are present in an amount of at least 0.5 mmol/g of the polymeric binder and up to and including 7 mmol/g of the polymeric binder.

The advantageous polymeric backbones present in the polymeric b binders used in the present invention can comprise any polymeric binder such as a polyester backbone, polyurethane backbone, polyamide backbone, polyvinyl acetal backbone, or polyacrylic backbone.

In some particularly useful embodiments of the negative-working lithographic printing plate precursor of this invention, the polymeric binder comprises a polymeric backbone having the following recurring units arranged in random order along the backbone:

same or different -A- recurring units comprising pendant groups comprising ethylenically unsaturated polymerizable groups, same or different —B— recurring units represented by the following Structure (Ia), (IIa), or (IIIa):

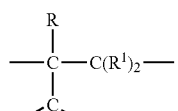

(Ia)

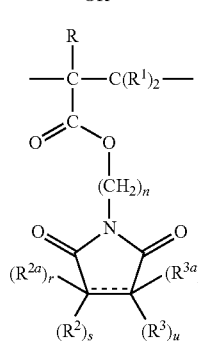

(IIa)

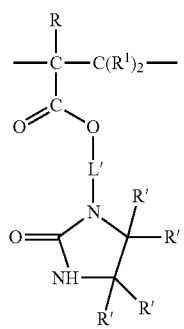

(IIIa)

wherein:

each of R and $R^1$ is independently hydrogen, cyano, a substituted or unsubstituted alkyl group, or a halogen, each R' is independently hydrogen, or a substituted or unsubstituted alkyl or a substituted or unsubstituted aryl group, $R^2$, $R^{2a}$, $R^3$, and $R^{3a}$ are independently hydrogen or a substituted or unsubstituted alkyl group, or $R^2$ and $R^3$ or $R^{2a}$ and $R^{3a}$, together with the two carbon atoms to which they are bonded, form a substituted or unsubstituted aryl group, substituted or unsubstituted heteroaryl group, or a substituted or unsubstituted carbocyclic or heterocyclic group, $R^4$ is hydrogen or a substituted or unsubstituted alkyl group having 1 to 10 carbon atoms, L and L' are independently divalent substituted or unsubstituted linking groups, n is 0 or 1, r, s, t, and u are independently 0 or 1 provided that one of r and s is 0 if the carbon atom to which $R^2$ and $R^{2a}$ are bonded is part of —C=C— double bond, and further provided that one of t and u is 0 if the carbon atom to which $R^3$ and $R^{3a}$ are bonded is part of a —C=C— double bond, and the dotted line in Structure (IIa) indicates that a double bond may or may not be present, and optionally, same or different —C— recurring units that are different from the -A- and —B— recurring units.

The details of these embodiments are provided below.

The present invention also provides a method for making a lithographic printing plate comprising:

imagewise exposing the negative-working lithographic printing plate precursor of any embodiment of this invention to imaging radiation to provide exposed regions and non-exposed regions in the negative-working imageable layer, and developing the imagewise exposed precursor to remove the non-exposed regions of the negative-working imageable layer using a processing solution to provide a lithographic printing plate.

In particular embodiments, the method for making a lithographic printing plate comprises:

imagewise exposing the negative-working lithographic printing plate precursor comprising the polymeric binder that comprises -A- recurring units derived from allyl (meth)acrylate, —B— recurring units represented by Structure (Ia) wherein $R^4$ is hydrogen or a substituted or unsubstituted alkyl group having 1 to 4 carbon atoms and L is methylene, and —C— recurring units derived from (meth)acrylic acid, to imaging radiation to produce exposed regions and non-exposed regions in the negative-working imageable layer, developing the imagewise exposed precursor to remove the non-exposed regions of the negative-working imageable layer using a processing solution to provide a lithographic printing plate, and optionally, after the developing, baking the lithographic printing plate at a temperature of at least 180° C. and up to and including 300° C. for at least 10 seconds and up to and including 10 minutes.

Baking of imaged and developed lithographic printing plates is often carried out to extend its run length of run during printing. It is common practice in the industry to bake positive-working lithographic printing plates comprising novolac binders in the imageable layers or negative-working lithographic printing plates based on acid-catalyzed crosslinking of imageable layers containing resole or novolac resins. Negative-working lithographic printing plates comprising free radical photopolymerization chemistry have an advantage over the other types of lithographic printing plates because of their much simpler construction and they require less chemically-consuming processing.

It was found that known negative-working lithographic printing plates comprising such free radical polymerization chemistry are in principle bakeable if high temperature or long baking times are used. However, such harsh baking conditions can readily deform the lithographic printing plates. Such deformations can cause the lithographic printing plates to crack while being used for printing on-press and this can also cause damage of components of the printing presses (for example, damage to the rubber blankets).

The use of the particular inventive binders according to this invention enable the negative-working lithographic printing plate precursors to have improved bakeability, for example bakeability at lower temperatures or for shorter times.

Thus, the present invention provides various advantages including higher photospeed, good shelf life, and improved bakeability (shorter baking times or lower baking temperatures) while maintaining desired printing plate run lengths. These advantages are provided using a unique polymeric binder in the negative-working imageable layer, which polymeric binder has a unique combination of (a) and (b) pendant groups in specified amounts as described below. Even further improvements are provided by including some (c) pendant groups as described below.

DETAILED DESCRIPTION OF THE INVENTION

Definitions

As used herein to define various components of the negative-working imageable layer ("imageable layer"), coating formulations, and developers (processing solutions), unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor," "precursor," and "negative-working lithographic printing plate precursor" are meant to be references to embodiments of the present invention.

The term "support" is used herein to refer to an aluminum-containing material (web, sheet, foil, or other form) that is then treated to prepare a "substrate" that refers to a hydrophilic article upon which various layers, including the negatively-working imageable layer, are coated.

As used herein, the term "radiation absorber" refers to compounds or materials that are sensitive to certain wavelengths of radiation and can cause polymerization within the layer in which they are disposed.

As used herein, the term "infrared" refers to radiation having a of at least 700 nm and higher. In most instances, the term "infrared" is used to refer to the "near-infrared" region of the electromagnetic spectrum that is defined herein to be at least 700 nm and up to and including 1400 nm.

As used herein, the term "UV radiation" generally refers to radiation having a $\lambda_{max}$ of at least 250 nm and up to and including 450 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

The term "copolymer" refers to polymers composed of two or more different repeating or recurring units that are arranged randomly along the polymer backbone.

For polymeric binders used in this invention, the term "arranged randomly" means that blocks of recurring units are not intentionally incorporated into the polymeric binders, but that recurring units are incorporated into the backbone in a random fashion using known polymerization procedures that do not encourage the formation of block copolymers.

Recurring units in polymeric binders described herein are generally derived from the corresponding ethylenically unsaturated polymerizable monomers used in a polymerization process, which ethylenically unsaturated polymerizable monomers can be obtained from various commercial sources or prepared using known chemical synthetic methods.

As used herein, the term "ethylenically unsaturated polymerizable monomer" refers to a compound comprising one or more ethylenically unsaturated (—C=C—) bonds that are polymerizable using free radical or acid-catalyzed polymerization reactions and conditions. It is not meant to refer to chemical compounds that have only unsaturated —C=C— bonds that are not polymerizable under these conditions. The "ethylenically unsaturated polymerizable groups" present in the (a) pendant groups described herein are similarly defined.

Unless otherwise indicated, the term "alkyl" refers to a straight chain or branched saturated hydrocarbon group comprising 1 to 18 carbon atoms, such as 1 to 10 carbon atoms. The alkyl group can optionally comprise one or more substituents that can be a halogen atom, cyano, nitro, amino, carbonyloxyester or ether group.

Unless otherwise indicated, the term "aryl" refers to an aromatic carbocyclic group optionally with one or more fused rings comprising 5 to 14 carbon atoms. The aryl group can optionally comprise one or more substituents (such as 1 to 3) that can be a halogen atom, alkyl, aryl, cyano, nitro, amino, carbonyloxyester, or ether group. Particularly useful aryl groups are substituted or unsubstituted phenyl or naphthyl groups.

Unless otherwise indicated, the term "heteroaryl" refers to a heterocyclic aromatic group comprising 5 to 10 atoms in the ring(s) in which 1 or more carbon atoms are replaced with an oxygen, sulfur, or nitrogen atom, and such heteroaryl groups can be substituted as described above for the aryl groups.

Unless otherwise indicated, the term "carbocyclic" group that is non-aromatic refers to a ring comprising 5 to 10 carbon atoms in the ring that can also be substituted with one or more substituents as described above for the aryl groups.

Unless otherwise indicated, the term "heterocyclic" group that is non-aromatic refers to a group comprising 5 to 10 atoms in the ring(s) in which 1 or more carbon atoms are replaced with an oxygen, sulfur, or nitrogen atom, and such non-aromatic heterocyclic groups can be substituted as described above for the aryl groups.

A fused ring or ring system refers to a ring that shares two atoms with the ring to which it is fused.

As used herein, the term "layer" or "coating" can consist of one disposed or applied layer or a combination of several sequential disposed or applied layers. The one or more layers are considered radiation-sensitive or negative-working imageable if at least one of the layers is radiation-sensitive.

Substrate

The substrate that is present in the precursor of this invention generally has a hydrophilic surface, or at least a surface that is more hydrophilic than the applied negative-working imageable layer on the imaging side. The substrate comprises a support that can be composed of any material that is conventionally used to prepare lithographic printing plate precursors. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both flat surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 $g/m^2$ and up to and including 5 $g/m^2$ and more typically at least 3 $g/m^2$ and up to and including 4.3 $g/m^2$. Phosphoric acid anodization generally provides an oxide weight on the surface of from at least 1.5 $g/m^2$ and up to and including 5 $g/m^2$ and more typically at least 1 $g/m^2$ and up to and including 3 $g/m^2$.

An interlayer can be formed by treatment of the aluminum support with, for example, a silicate, dextrin, calcium zirconium fluoride, hexafluorosilicic acid, poly(vinyl phosphonic acid) (PVPA), vinyl phosphonic acid copolymer, poly[(meth) acrylic acid], or acrylic acid copolymer to increase hydrophilicity. Still further, the aluminum support can be treated with a phosphate solution that can further contain an inorganic fluoride (PF). The aluminum support can be electrochemically-gained, sulfuric acid-anodized, and treated with PVPA or PF using known procedures to improve surface hydrophilicity.

A substrate can also comprise a grained and sulfuric acid anodized aluminum-containing support that has also been treated with an alkaline or acidic pore-widening solution to provide its outer surface with columnar pores so that the diameter of the columnar pores at their outermost surface is at least 90% of the average diameter of the columnar pores. This substrate further comprises a hydrophilic layer disposed directly on the grained, sulfuric acid anodized and treated aluminum-containing support, and the hydrophilic layer comprises a non-crosslinked hydrophilic polymer having carboxylic acid side chains. Further details of such substrates and methods for providing them are provided in U.S. Patent Application Publication 2013/0052582 (Hayashi) that is incorporated herein with respect to the substrates.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents, a slipping layer, or a matte layer to improve handling and "feel" of the imageable element.

Negative-Working Imageable Layer

Embodiments of this invention can be formed by suitable application of a negative-working radiation-sensitive composition as described below to a suitable substrate to form a negative-working (radiation sensitive) imageable layer on that substrate. In general, the negative-working radiation-sensitive composition (and imageable layer) comprises a free radically polymerizable component, a radiation absorber, an initiator composition that is capable of generating free radicals upon exposure to imaging radiation, and a novel polymeric binder, which components are described in more detail below. There is generally only a single negative-working imageable layer comprising the negative-working radiation-sensitive composition. It can also be the outermost layer in the precursor, but in some embodiments, there is an outermost water-soluble overcoat layer (also known as a topcoat) disposed over the one or more negative-working imageable layers. Such an overcoat is described below.

Many details of negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449, 650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285, 372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Shrehmel et al.), U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Pat. No. 7,672,241 (Munnelly et al.), and U.S. Patent Application Publications 2003/0064318 (Huang et al.), 2004/0265736 (Aoshima et al.), 2005/0266349 (Van Damme et al.), 2006/0019200 (Vermeersch et al.), and 2009/0092923 (Hayashi). Some of the noted teachings relate to negative-working radiation sensitive compositions that are used in imaged precursors that are processed off-press using a suitable processing solution, while others relate to on-press developable negative-working radiation sensitive compositions. Both types of radiation sensitive compositions and negative-working precursors are contemplated for the present invention.

The radiation-sensitive compositions and negative-working imageable layers used in precursors of the present invention include one or more polymeric binders that facilitate the developability of the imaged precursors. The inventive polymeric binders used in the practice of this invention can be considered the "primary" polymeric binders in the negative-working imageable layer. Such primary polymeric binders can be the only polymeric binders (100 weight % of total polymeric binders) in the negative-working imageable layer, or they can be mixed with other "secondary" polymeric binders that are described below. Where such mixtures of polymeric binders are used, the primary polymeric binders comprise at least 50 weight % of the total polymeric binders and generally at least 70 weight % and up to and including 99 weight % of the total polymeric binders.

The primary polymeric binders used in the practice of this invention generally have at least two essential features: (1) crosslinkability due to ethylenically unsaturated polymerizable pendant groups, and (2) pendant groups that provide the polymeric binder with improved thermal "bakeability".

The useful polymeric binders for this invention comprise a polymeric backbone and further comprise at least (a) pendant groups and (b) pendant group distributed in random order along the polymeric backbone. The polymeric binder comprises a polymeric backbone that can be a polyester backbone, polyurethane backbone, polyamide backbone, polyvinyl acetal backbone, or polyacrylic backbone, as long as the (a) and (b) pendant groups are present as described herein. The polyacrylic backbones are particularly useful and comprise the -A- and —B— recurring units, and optional —C— recurring units, as described below.

The essential (a) pendant groups are generally present in the polymeric binder in an amount of at least 0.5 mmol/g of the polymeric binder and up to and including 7 mmol/g of the polymeric binder, and more typically of at least 1 mmol/g of the polymeric binder and up to and including 4 mmol/g of the polymeric binder.

The essential (b) pendant groups are generally present in the polymeric binder, independently of the (a) pendant groups, in an amount of at least 0.5 mmol/g of the polymeric binder and up to and including 7 mmol/g of the polymeric binder, and more typically at least 1 mmol/g of the polymeric binder and up to and including 4 mmol/g of the polymeric binder.

The polymeric binders can further comprise (c) pendant groups that are acidic in nature, for example carboxylic acid, sulfonic acid, phosphonic acid, and phosphoric acid groups, which are distributed in random order along the polymeric backbone. The carboxylic acid pendant groups are particularly useful. Such (c) pendant groups can be present in the in the polymeric binder in an amount of at least 0.2 mmol/g of the polymeric binder and up to and including 4 mmol/g of the polymeric binder, and more typically at least 0.5 mmol/g of the polymeric binder and up to and including 3 mmol/g of the polymeric binder.

The weight average molecular weight of the polymeric binder useful in the present invention (as determined by gel permeation chromatography) is at least 5,000 and up to an including 4,000,000, and typically at least 10,000 and up to and including 500,000.

Each of the essential (a) pendant groups comprises one or more ethylenically unsaturated polymerizable groups, and generally only one ethylenically unsaturated polymerizable group for each pendant group. For example, representative (a) pendant groups comprise alkene groups having at least 2 carbon atoms and at least one —C=C— moiety that is polymerizable using free radical or acid catalyzed polymerization chemistry, and useful alkene groups include but are not limited to vinyl ether —$CH_2$=$CH_2$—O—, vinyl amine —$CH_2$=$CH_2$—NR— (wherein R is hydrogen or an alkyl), allyl ether —$CH_2$=$CH_2$—$CH_2$—O—, allyl amine —$CH_2$=$CH_2$—$CH_2$—NR—, (meth)acryl ester —$CH_2$=$CH_2$—CR—CO—O—, (meth)acryl amide —$CH_2$=$CH_2$—CR—CO—NR—, and aryl vinyl Aryl- CR=CH$_2$ with (wherein R is hydrogen or an alkyl) groups. Most useful are the allyl ether and (meth)acryl ester groups.

The essential (h) pendant groups are represented by the following Structures (I), (II), and (III):

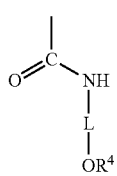
(I)

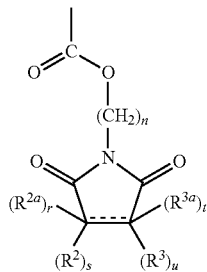
(II)

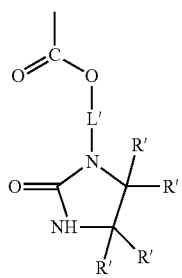
(III)

wherein each R' in Structure (III), is independently hydrogen, or a substituted or unsubstituted alkyl (for example having 1 to 8 carbon atoms including benzyl groups) or a substituted or unsubstituted aryl group having 6 or 10 carbon atoms in the carbocyclic ring (including methyl-substituted phenyl groups). Particularly useful R' groups are hydrogen, methyl, ethyl, or phenyl, but in many embodiments, each R' group is hydrogen or at least three of the R' groups are hydrogen.

In Structure (II), $R^2$, $R^{2a}$, $R^3$, and $R^{3a}$ are independently hydrogen or a substituted or unsubstituted alkyl group (for example, having 1 to 10 carbon atoms including benzyl groups), or $R^2$ and $R^3$ or $R^{2a}$ and $R^{3a}$, together with the two carbon atoms to which they are bonded, form a substituted or unsubstituted aryl group having 6 or 10 carbon atoms in the carbocyclic ring (including methyl-substituted phenyl rings), substituted or unsubstituted heteroaryl group (for example having 5 to 10 carbon and heteroatoms in the aromatic ring), or a substituted or unsubstituted carbocyclic or heterocyclic group that is non-aromatic (for example having 5 to 10 carbon atoms or 5 to 10 carbon and heteroatoms). In some particularly useful embodiments, $R^2$, $R^{2a}$, $R^3$, and $R^{3a}$ are independently hydrogen or a substituted or unsubstituted alkyl group having 1 to 6 carbon atoms, or $R^2$ and $R^3$ or $R^{2a}$ and $R^{3a}$, together with the two carbon atoms to which they are bonded, form a substituted or unsubstituted phenyl group, substituted or unsubstituted heteroaryl group, or a substituted or unsubstituted cycloalkyl group. The cycloalkyl group can also comprise a methylene bridge or alkylene bridge optionally containing an oxygen atom.

If $R^2$ and $R^3$ form a ring, $R^{2a}$ and $R^{3a}$ can both be hydrogen, and if $R^{2a}$ and $R^{3a}$ form a ring, $R^2$ and $R^3$ are both hydrogen.

In Structure (I), $R^4$ is hydrogen or a substituted or unsubstituted alkyl group (for example, having 1 to 10 carbon atoms), and in many embodiments, $R^4$ is hydrogen, or a methyl, ethyl, propyl (linear or branched), or butyl (linear or branched) group.

In Structures (I) and (III), respectively, L and L' are independently substituted or unsubstituted divalent linking groups having 1 to 10 carbon or heteroatoms in the linking chain, which can be substituted with one or more aliphatic or aromatic substituents. For example, useful divalent linking groups include but are not limited to substituted or unsubstituted alkylene groups, substituted or unsubstituted arylene groups, substituted or unsubstituted heterocyclylene groups, or combinations thereof, and any of these groups can be interrupted with a carbonyl, oxy, or other heteroatom groups, and form for example single or repeating alkyleneoxy groups. In addition, the divalent linking groups can include single or repeating —O—Si(R)$_2$— groups. For example, particularly useful L' divalent linking groups in Structure (III) comprise substituted or unsubstituted divalent hydrocarbon groups having 1 to 4 carbon atoms.

In Structure (II), n is 0 or 1, and in particularly useful embodiments, n is 0.

In Structure (II), r, s, t, and u are independently 0 or 1 provided that one of r and s is 0 if the carbon atom to which $R^2$ and $R^{2a}$ are bonded is part of non-ethylenically unsaturated polymerizable —C=C— double bond, and further provided that one of t and u is 0 if the carbon atom to which $R^3$ and $R^{3a}$ are bonded is part of a —C=C— double bond, and the dotted line in Structure II indicates that a double bond may or may not be present.

Many useful embodiments of the primary polymeric binders are vinyl polymers that comprise the following recurring units in random order along the polyacrylic backbone:

same or different -A- recurring units comprising pendant groups comprising ethylenically unsaturated polymerizable groups, same or different —B— recurring units represented by following Structure (Ia), (IIa), and (IIIa):

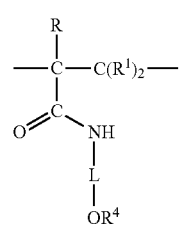
(Ia)

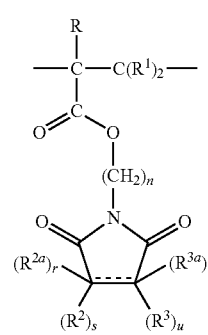
(IIa)

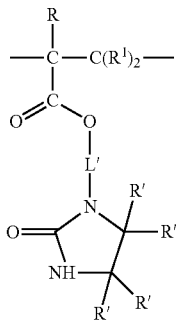

(IIIa)

wherein each of R and $R^1$ is independently hydrogen, cyano, a substituted or unsubstituted alkyl group (for example, having 1 to 4 carbon atoms), or a halogen. For example, each of R and $R^1$ is independently hydrogen, methyl, ethyl, or a halogen, or more likely each of R and $R^1$ is hydrogen or methyl.

In the noted Structures (Ia), (IIa), and (IIIa), each R', $R^2$, $R^{2a}$, $R^3$, $R^{3a}$, $R^4$, L, L', n, r, s, t, u, and the dotted line are defined as described above for Structures (I), (II), and (III).

The inventive polymeric binders used in this invention can comprise additional pendant groups besides the (a) pendant groups and (b) pendant groups, for example, the (c) pendant groups described above. The particularly useful polyacrylic binders can comprise the -A- recurring units and the —B— recurring units represented by Structures (Ia)-(IIIa), as well as the —C— recurring units described below.

For example, useful —B— recurring units can be derived from a variety of ethylenically unsaturated polymerizable monomers including but not limited to, N-methylol methacrylamide, N-methylol acrylamide, N-methoxymethyl methacrylamide, N-methylol acrylamide, N-methoxyethyl methacrylamide, N-methoxyethyl acrylamide, N-methoxybutyl methacrylamide, N-methoxybutyl acrylamide, N-n-butoxymethyl methacrylamide, N-n-butoxymethyl acrylamide, N-ethoxymethyl methacrylamide, N-ethoxymethyl acrylamide, N-iso-butoxymethyl methacrylamide, N-iso-butoxymethyl acrylamide N-methacryloyl succinimide, N-acryloyl succinimide, N-methacryloyl tetrahydrophthalimide, N-acryloyl tetrahydrophthalimide, N-(2-methacryoyloxyethyl)-ethylene urea, N-(2-acryoyloxyethyl)-ethylene urea, N-(2-methacryoyloxybutyl)-ethylene urea, and N-(2-acryoyloxybutyl)-ethylene urea.

In many useful embodiments, the —C— recurring units comprising a pendant —C(=O)—$NH_2$, acidic, or —$[(CH_2—CR_y—O)]_m$—$R_x$ group, wherein $R_y$ and $R_x$ are independently hydrogen or methyl, and m is 0 to 20. Particularly useful —C— recurring units include those comprising pendant acidic groups such as pendant groups comprising carboxylic acid, sulfonic acid, and phosphoric acid groups.

Useful —C— recurring units can be derived from a variety of ethylenically unsaturated polymerizable monomers including but not limited to, hydroxyethyl (meth)acrylate, hydroxypropyl (meth)acrylate, polyethylene glycol (meth)acrylate, (meth)acrylamide, N-ethyl(meth)acrylamide, N-iso-propyl(meth)acrylamide, (meth)acrylic acid, maleic acid anhydride ring opened with aliphatic alcohols, methyl (meth)acrylate, benzyl (meth)acrylate, and (meth)acrylonitrile. Recurring units derived from acrylic acid and methacrylic acid are particularly useful.

The polymeric binders useful according to the present invention can comprise recurring units, the recurring units comprising the (a) pendant groups can be present in an amount of at least 20 mol %, and the recurring units comprising (b) pendant groups can be present in an amount of at least 5 mol %, both based on the total recurring units in the polymeric binder.

In the vinyl polymeric binders useful according to this invention can comprise the described —C— recurring units in an amount of at least 10 mol %, based on the total recurring units in the polymeric binder. For example, useful —C— recurring units can comprise a pendant —C(=O)—$NH_2$, acidic, or —$[(CH_2—CR_y—O)]_m$—$R_x$ group, wherein $R_y$ and $R_x$ are independently hydrogen or methyl, and m is from 1 and up to and including 20.

In other embodiments, the vinyl polymeric binder useful according to the present invention comprises -A- recurring units in an amount of at least 30 mol % and up to and including 70 mol %, —B— recurring units in an amount of at least 20 mol % and up to and including 70 mol %, and —C— recurring units in an amount of at least 10 mol % and up to and including 40 mol %, all based on the total recurring units in the polymeric binder.

Some useful polymeric binders for this invention comprise:

-A- recurring units that are derived from allyl (meth)acrylate,

—B— recurring units that are represented by Structure (Ia) wherein $R^4$ is hydrogen or a substituted or unsubstituted alkyl having 1 to 4 carbon atoms, and L is methylene, and —C— recurring units that comprise a pendant —C(=O)—$NH_2$, acidic, or —$[(CH_2—CR_y—O)]_m$—$R_x$ group, wherein $R_y$ and $R_x$ are independently hydrogen or methyl, and m is from 1 and up to and including 20.

Some embodiments of the polymeric binder comprise recurring units derived from each of allyl (meth)acrylate, an alkoxymethyl methacrylamide, and (meth)acrylic acid, wherein:

the recurring units derived from allyl (meth)acrylate are present in an amount of at least 0.5 mmol/g of the polymeric binder and up to and including 7 mmol/g of the polymeric binder, the recurring units derived from alkoxymethyl methacrylamide are present in an amount of at least 0.5 mmol/g of the polymeric polymer and up to and including 7 mmol/g or the polymeric binder, and the recurring units derived from (meth)acrylic acid are present in an amount of at least 0.2 mmol/g of the polymeric binder and up to and including 4 mmol/g of the polymeric binder.

The negative-working lithographic printing plate precursor of the present invention generally comprises one or more polymeric binders described herein in the negative-working imageable layer in an amount of at least 20 weight % and up to and including 80 weight %, or typically at least 30 weight % and up to and including 60 weight %, based on total dry weight of the negative-working imageable layer.

The polymeric binders useful in the present invention can be prepared using known polymerization procedures to prepare either condensation polymers or vinyl polymers, using known reactants and polymerization conditions. Representative polymerization procedures are described below before the Examples.

In very useful embodiments of this invention, the negative-working lithographic printing plate precursors comprise a vinyl polymeric binder comprising -A- recurring units in an amount of at least 30 mol % and up to and including 70 mol %, —B— recurring units in an amount of at least 20 mol % and up to and including 70 mol %, and —C— recurring units in an amount of at least 10 mol % and up to and including 40 mol %, all based on the total recurring units in the polymeric binder, the —B— recurring units being derived from one or more ethylenically unsaturated polymerizable monomers represented by the following Structure (Ia), (IIa), or (IIIa) described above:

wherein:

each of R and $R^1$ is independently hydrogen, cyano, a substituted or unsubstituted alkyl group, or a halogen, each R' is independently hydrogen, or a substituted or unsubstituted alkyl or a substituted or unsubstituted aryl group, $R^2$, $R^{2a}$, $R^3$, and $R^{3a}$ are independently hydrogen or a substituted or unsubstituted alkyl group, or $R^2$ and $R^3$ or $R^{2a}$ and $R^{3a}$, together with the two carbon atoms to which they are bonded, form a substituted or unsubstituted aryl group, substituted or unsubstituted heteroaryl group, or a substituted or unsubstituted carbocyclic or heterocyclic group, $R^4$ is hydrogen or a substituted or unsubstituted alkyl group, L and L' are independently divalent substituted or unsubstituted linking groups, n is 0 or 1, r, s, t, and u are independently 0 or 1 provided that one of r and s is 0 if the carbon atom to which $R^2$ and $R^{2a}$ are bonded is part of —C=C— double bond, and further provided that one of t and u is 0 if the carbon atom to which $R^3$ and $R^{3a}$ are bonded is part of a —C=C— double bond, and the dotted line in Structure (IIa) indicates that a double bond may or may not be present, and the —C— recurring units comprise a pendant —C(=O)—$NH_2$, acidic, or —$[(CH_2—CR_y—O)]_m$—$R_x$ group, wherein $R_y$ and $R_x$ are independently hydrogen or methyl, and m is at least 1 and up to and including 20.

In such embodiments, the polymeric binder can comprise -A- recurring units derived from allyl (meth)acrylate, —B— recurring units represented by Structure (Ia) wherein $R^4$ is hydrogen or a substituted or unsubstituted alkyl group having 1 to 4 carbon atoms and L is methylene, and —C— recurring units derived from (meth)acrylic acid.

The negative-working lithographic printing plate precursors of the present invention can comprise one or more of the polymeric binders described above as well as a radiation absorber that is either:

an infrared radiation absorber that effectively absorbs infrared radiation at a wavelength of at least 700 nm and up to and including 1400 nm, or a sensitizer that effectively absorbs radiation at a wavelength of at least 350 nm and up to and including 450 nm.

While the polymeric binders (also known as the "primary" polymeric binders) described above can be the only polymeric binders in the negative-working imageable layers, it is also possible for these polymeric binders to be mixed with one or more secondary polymeric binders as described above. Such secondary polymeric binders are defined as follows.

Useful secondary polymeric binders include but are not limited to, those that are present at least partially as discrete particles (non-agglomerated). Such secondary polymeric binders can be present as discrete particles having an average particle size of at least 10 nm and up to and including 500 nm, and typically of at least 100 nm and up to and including 450 nm, and that are generally distributed uniformly within that layer. The particulate polymeric binders exist at room temperature as discrete particles, for example in an aqueous dispersion. Such secondary polymeric binders generally have a number average molecular weight ($M_n$) of at least 5,000 and typically at least 20,000 and up to and including 1,000,000, or of at least 30,000 and up to and including 200,000, as determined by Gel Permeation Chromatography.

Useful particulate secondary polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (noted above), U.S. Pat. No. 7,005,234 (Hoshi et al.), and U.S. Pat. No. 7,368,215 (Munnelly et al.), and US Patent Application Publication 2005/0003285 (Hayashi et al.), the disclosures of all of which are incorporated herein by reference with respect to these secondary polymeric binders. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate secondary polymeric binders can have a backbone comprising multiple (at least two) urethane moieties. Such polymeric binders generally have a number average molecular weight ($M_n$) of at least 2,000 and typically at least 100,000 and up to and including 500,000, or at least 100,000 and up to and including 300,000, as determined by Gel Permeation Chromatography.

Other useful secondary polymeric binders are particulate poly(urethane-acrylic) hybrids that are distributed (usually uniformly) throughout the imageable layer. Each of these hybrids has a number average molecular weight ($M_n$) of at least 50,000 and up to and including 500,000 and the particles have an average particle size of at least 10 nm and up to and including 10,000 nm (typically at least 30 nm and up to and including 500 nm or at least 30 nm and up to and including 150 nm). These hybrids can be either "aromatic" or "aliphatic" in nature depending upon the specific reactants used in their manufacture. Blends of particles of two or more polyurethane-acrylic) hybrids can also be used. Some poly (urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, anti-foaming agents, dispersing agents, anti-corrosive agents, and optionally pigments and water-miscible organic solvents.

Still other useful secondary polymeric binders can be homogenous, that is, film-forming, non-particulate, or dissolvable in the coating solvent. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), U.S. Pat. No. 8,119,331 (Baumann et al.), and U.S. Pat. No. 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.). Useful are random copolymers derived from polyethylene glycol methacrylate/-acrylonitrile/styrene monomers in random fashion and in particulate form, dissolved random copolymers derived from carboxyphenyl methacrylamide/-acrylonitrile/methacrylamide/N-phenyl maleimide, random copolymers derived from polyethylene glycol methacrylate/acrylonitrile/vinyl carbazole/styrene/-methacrylic acid, random copolymers derived from N-phenyl maleimide/-methacrylamide/methacrylic acid, random copolymers derived from urethane-acrylic intermediate A (the reaction product of p-toluene sulfonyl isocyanate and hydroxyl ethyl methacrylate)/acrylonitrile/N-phenyl maleimide, and random copolymers derived from N-methoxymethyl methacrylamide/-methacrylic acid/acrylonitrile/n-phenylmaleimide. By "random" copolymers, we mean the conventional use of the term, that is, the structural units in the polymer backbone that are derived from the monomers are arranged in random order as opposed to being block copolymers, although two or more of the same structural units can be in a chain incidentally.

The secondary polymeric binders also can be selected from any alkaline solution soluble (or dispersible) polymer having an acid value of at least 20 meq KOH/g of polymer and up to and including 400 meq KOH/g of polymer. The following described secondary polymeric binders are useful in the manner but this is not an exhaustive list:

I. Film-forming polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.). Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Film-forming polymers having pendant allyl ester groups as described in U.S. Pat. No. 7,332,253 (Tao et al.). Such polymers can also include pendant cyano groups or have recurring units derived from a variety of other monomers as described in Col. 8, line 31 to Col. 10, line 3 of the noted patent.

III. Film-forming polymers having all carbon backbones wherein at least 40 mol % and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. Such polymeric binders are described in more detail in U.S. Patent Application Publication 2008-0280229 (Tao et al.).

IV. Film-forming polymers that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.). Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.).

V. Film-forming polymers that have pendant 1H-tetrazole groups as described in U.S. Patent Application Publication 2009-0142695 (Baumann et al.).

VI. Still other useful secondary polymeric binders can be film-forming or exist as discrete particles and include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Other useful polymeric binders are particulate polyurethane-acrylic) hybrids that are distributed (usually uniformly) throughout the imageable layer. Each of these hybrids has a molecular weight ($M_n$) of at least 50,000 and up to and including 500,000 and the particles have an average particle size of at least 10 nm and up to and including 10,000 nm (typically at least 30 nm and up to and including 500 nm), as determined by Gel Permeation Chromatography.

The total polymeric binders (both primary and secondary if present) are provided in the negative-working imageable layer an amount of at least 40 weight % and up to and including 70 weight %, or typically at least 50 weight % and up to and including 70 weight %, based on the total dry negative-working imageable layer weight (or total solids of the corresponding coating formulation).

The negative-working radiation-sensitive composition (and negative-working imageable layer) comprises one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable components include urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (Baumann et al.), which radically polymerizable components include 1H-tetrazole groups, and the disclosure of which publication is incorporated herein by reference.

The negative-working radiation-sensitive composition (negative-working imageable layer) also includes an initiator composition that includes one or more initiators that are capable of generating free radicals sufficient to initiate polymerization of all the various free radically polymerizable components upon exposure of the composition to imaging radiation. The initiator composition is generally responsive, for example, to electromagnetic radiation in the desired spectral regions, for example in the broad infrared spectral range of at least 250 nm and up to and including 1400 nm. In some embodiments, the initiator composition is responsive to infrared radiation of at least 700 nm and up to and including 1400 nm or at least 750 nm and up to and including 1250 nm. In other embodiments, the initiator composition is responsive to exposing radiation in the violet region of at least 250 nm and up to and including 450 nm and typically of at least 350 nm and up to and including 450 nm. The initiator composition can be designed for any of the noted infrared radiation exposures.

For example, the initiator composition can includes one or more electron acceptors and one or more co-initiators that are capable of donating electrons, hydrogen atoms, or a hydrocarbon radical.

In general, suitable initiator compositions include but are not limited to, aromatic sulfonylhalides, trihalogenomethylsulfones, imides (such as N-benzoyloxy-phthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Hexaarylbiimidazoles, onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles are also described in U.S. Pat. No. 4,565,769 (Dueber et al.) and U.S. Pat. No. 3,445,232 (Shirey) and can be prepared according to known methods, such as the oxidative dimerization of triarylimidazoles.

Useful initiator compositions for infrared radiation-sensitive compositions include onium compounds (salts) including ammonium, sulfonium, iodonium, diazonium, and phosphonium compounds, particularly in combination with infrared radiation-sensitive cyanine dyes. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion.

Iodonium cations can be supplied as part of one or more iodonium salts, and the iodonium cations can be supplied as iodonium borates also containing suitable boron-containing anions particularly in combination with infrared radiation-sensitive cyanine dyes. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.).

Useful infrared radiation-sensitive initiator compositions can comprise one or more diaryliodonium borate compounds. Representative iodonium borate compounds useful in this invention include but are not limited to, 4-octyloxy-phenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition. U.S. Pat. No. 8,043, 787 (Hauck et al.) the disclosure of which is incorporated herein by reference with respect to useful initiator compositions, describes particularly diaryliodonium initiator compositions containing boron-containing anions.

Thus, in some embodiments, the initiator composition that is capable of generating free radicals upon exposure to imaging infrared radiation comprises a diaryliodonium cation and a boron-containing anion, wherein the diaryliodonium cation is represented by the following Structure (IV):

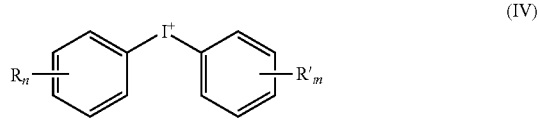
(IV)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5. The sum of m and n can be 1 to 6. The boron-containing anion is represented by the following Structure (V):

(V)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups, and the sum of m and n can be 1 to 6.

The amount of initiator composition in the negative-working imageable layer would be readily apparent to one skilled in the art and would be dependent upon the particular negative-working radiation-sensitive composition to be used.

The negative-working radiation-sensitive composition and negative-working imageable layers also comprise one or more radiation absorbers such as infrared radiation absorbers or one or more UV sensitizers. The total amount of one or more radiation absorbers is at least 1 weight % and up to and including 30 weight %, or typically at least 5 weight % and up to and including 20 weight %, based on the negative-working imageable layer total solids.

In some embodiments, the negative-working radiation-sensitive composition contains one or more UV sensitizers as radiation absorbers when the initiator composition is UV radiation sensitive (that is sensitive to at least 250 nm and up to and including 450 nm), thereby facilitating photopolymerization. In other embodiments, the UV sensitizers are sensitive to "violet" radiation in the range of at least 350 nm and up to and including 450 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describes useful bisoxazole derivatives and analogues, and U.S. Patent Application Publications 2006/0063101 and 2006/0234155 (both Baumann et al.), the disclosures of all of which are incorporated herein by reference for these sensitizers.

Still other useful UV-sensitive sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-sensitive radiation absorbers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Still other useful radiation absorbers for the violet region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure $G\text{-}(Ar_1)_3$ wherein $Ar_1$ is the same or different, substituted or unsubstituted carbocyclic aryl group having 6 to 12 carbon atoms in the ring, and G is a furan or oxazole ring, or the Structure $G\text{-}(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. At least one of $R'_1$ through $R'_3$ is an —$N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet radiation absorbers includes compounds represented by the Structure $Ar_1\text{-}G\text{-}Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Some useful infrared radiation absorbers are sensitive to both infrared radiation (typically of at least 700 nm and up to and including 1400 nm) and visible radiation (typically of at least 450 nm and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.).

Other useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that conically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are also described, for example, in U.S. Pat. No. 7,452,638 (Yu et al.), and U.S. Patent Application Publications 2008/0254387 (Yu et al.), 2008/0311520 (Yu et al.), 2009/0263746 (Ray et al.), and 2010/0021844 (Yu et al.).

Thus, the radiation absorber can be an infrared radiation absorber and the negative-working imageable layer can be sensitive to infrared radiation in many embodiments. In other embodiments, the radiation absorber is sensitive to UV (violet) radiation and renders the negative-working imageable layer UV (violet) sensitive.

The negative-working imageable layer used in this invention can also include a poly(alkylene glycol) or an ether or ester thereof that has a molecular weight of at least 200 and up to and including 4000.

Additional additives to the negative-working imageable layer include color developers or acidic compounds. Color developers are meant to include monomeric phenolic compounds, organic acids or metal salts thereof, oxybenzoic acid esters, acid clays, and other compounds described for example in U.S. Patent Application Publication 2005/0170282 (Inno et al.). The negative-working imageable layer can also include a variety of other optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The negative-working imageable layer also optionally includes a phosphate (meth)acrylate having a molecular weight generally greater than 250 as described in U.S. Pat. No. 7,429,445 (Munnelly et al.).

Outermost Water-Soluble Overcoat Layer

The negative-working lithographic printing plate precursor can have an outermost water-soluble overcoat layer disposed directly on the negative-working imageable layer (no intermediate layers between these two layers). This outermost water-soluble overcoat layer can be the outermost layer of the precursor and thus, when stacked with other precursors, this outermost overcoat layer of one precursor would be in contact with the backside of the substrate of the adjacent precursor above it.

Such outermost water-soluble overcoat layers can comprise one or more film-forming water-soluble polymeric binders in an amount of at least 60 weight % and up to and including 98 weight %, based on the total dry weight of the outermost water-soluble overcoat layer.

Such film-forming water-soluble polymeric binders generally include a modified or unmodified poly(vinyl alcohol) having a saponification degree of at least 30%, or a degree of at least 75%, or a degree of at least 90%, and a degree of up to and including 99.9%.

For example, the outermost water-soluble overcoat layer can include one or more film-forming water-soluble polymeric binders that comprise at least one modified poly(vinyl alcohol) that is modified with at least 0.1 mol % of one or more of the same or different groups selected from the group consisting of carboxylic acid, sulfonic acid, acetoacetyl, alkylene, silanol, amino, thioalkyl, glycol, sulfuric acid ester, phosphonic acid, and phosphoric acid ester groups. Further, one or more acid-modified poly(vinyl alcohol)s can be used as film-forming water-soluble polymeric binders in the outermost water-soluble overcoat layer. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly(vinyl alcohol), carboxylic acid-modified poly(vinyl alcohol), and quaternary ammonium salt-modified poly(vinyl alcohol), or combinations thereof. Specific commercial examples of the acid-modified poly(vinyl alcohol) include SD1000 that is available from Kuraray, and Gohsefimer K-210, Gohseran L-3266 and Gohseran CKS-50 that are available from Nippon Gohsei.

The outermost water-soluble overcoat layer can further comprise one or more other film-forming water-soluble polymers that are not poly(vinyl alcohol)s for example in an amount of at least 2 weight % and up to and including 40 weight %, of a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, vinyl acetate, and vinyl imidazole, and vinyl acetamide.

Alternatively, the outermost water-soluble overcoat layer can be formed predominantly using one or more of film-forming water-soluble polymeric binders such as poly(vinyl pyrrolidone), poly(ethyleneimine), poly(vinyl imidazole), gelatin or a gelatin derivative, cellulose derivatives, and random copolymers from two or more of vinyl pyrrolidone, ethyleneimine and vinyl imidazole, and mixtures of such polymers.

The outermost water-soluble overcoat layer formulations can also include cationic, anionic, amphoteric, or non-ionic wetting agents or surfactants, flow improvers or thickeners, antifoamants, colorants, and biocides. Details about such addenda and useful amounts are provided in WO 99/06890 (Pappas et al.), EP 1,788,429 (Loccufier et al.), and U.S. Patent Application Publications 2005/0266349 (Van Damme et al.), 2007/0231739 (Koizumi), 2007/0231740 (Yanaka et al.), and 2011/0053085 (Huang et al.).

The outermost water-soluble overcoat layer is generally present at a dry coating coverage of at least $0.1 \text{ g/m}^2$ and up to but less than $4 \text{ g/m}^2$, and typically at a dry coating coverage of at least $0.15 \text{ g/m}^2$ and up to and including $2.5 \text{ g/m}^2$. In some embodiments, the dry coating coverage is at least $0.1 \text{ g/m}^2$ and up to and including $1.5 \text{ g/m}^2$ or at least $0.1 \text{ g/m}^2$ and up to and including $0.9 \text{ g/m}^2$, such that the outermost water-soluble overcoat layer is relatively thin for removal during on-press development, or during off-press development when a separate prewash step is omitted.

The outermost water-soluble overcoat layer can optionally comprise organic wax particles dispersed, generally uniformly, within the one or more film-forming water-soluble polymeric binders. These organic wax particles are generally present in an amount of at least 0.05 weight % and up to and including 20 weight %, or in an amount of at least 0.5 weight % and up to and including 10 weight %, all based on the total dry outermost water-soluble overcoat layer weight.

Such organic wax particles can have an average largest dimension D(wax) (for example, average diameter if generally spherical in shape, or an equivalent circular diameter, ECD if irregular in shape) that is less than 0.9 of t (in μm), or less than 90% of the t dimension. In many embodiments, the organic wax particles have an average largest dimension D(wax) that is defined by the following equation (III):

$$0.06 \text{ times } t \leq D(\text{wax}) < 0.75 \text{ times } t (\text{in } \mu\text{m}).$$

For example, the organic wax particles can have an average largest dimension of at least 0.08 μm and up to and including 0.8 μm, or typically of at least 0.1 μm and up to and including 0.5 μm.

Such organic wax particles can have a melting temperature of at least 100° C. and up to and including 180° C., and typically of at least 115° C. and up to and including 150° C. These organic wax particles can also comprise fluorinated or non-fluorinated hydrocarbons including but not limited to, fluorinated and non-fluorinated polyolefins, such as low density polyethylene, high density polyethylene, polypropylene, polytetrafluoroethylene, or mixtures thereof. High density and low density polyethylene wax particles and polytetrafluoroethylene are particularly useful.

Useful organic wax particles can be prepared using known procedures as described for example, in WO96/010599 (Soler Codina). Some useful fluorinated and non-fluorinated hydrocarbon wax particles can also be purchased from a number of commercial sources such as Mitsui Chemical Inc. or Münzing Liquid Technologies GmbH.

In some preferred embodiments, the outermost water-soluble overcoat layer consists essentially of the one or more film-forming water-soluble polymeric binders, at least one of which is an acid-modified poly(vinyl alcohol) or a poly(vinyl alcohol) having a saponification degree of at least 70%, polyethylene wax particles or polytetrafluoroethylene organic wax particles, and at least 1 weight % and up to and including 5 weight % non-wax matte particles.

Negative-Working Lithographic Printing Plate Precursors

The negative-working radiation-sensitive compositions described above can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. They can also be applied by spraying onto a suitable support. Typically, the negative-working radiation-sensitive composition is applied and dried to form a negative-working imageable layer.

Illustrative of such manufacturing methods is mixing the various components needed for the imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and negative-working imageable layer formulations are described in the Invention Examples below. After proper drying, the coating weight of the negative-working imageable layer is generally at least $0.1 \text{ g/m}^2$ and up to and including $5 \text{ g/m}^2$ or at least $0.5 \text{ g/m}^2$ and up to and including $3.5 \text{ g/m}^2$.

Distinct non-imageable layers can also be present under the negative-working imageable layer to enhance developability or to act as thermal insulating layers.

A suitable outermost water-soluble overcoat layer formulation (as described above) can be applied to a dried negative-working imageable layer in a suitable manner, generally out of an aqueous solvent, and then dried as described below.

Once the various layers have been applied and dried on the substrate, the negative-working lithographic printing plate precursors can be enclosed in water-impermeable material that substantially inhibits the transfer of moisture to and from the element and "heat conditioned" as described in U.S. Pat. No. 7,175,969 (noted above).

The lithographic printing plate precursors can be stored and transported as stacks of precursors within suitable packaging and containers known in the art, and interleaf papers can be present between the adjacent precursors in the stacks, or in some embodiments, such interleaf papers can be omitted.

Imaging Conditions

During use, the lithographic printing plate precursor of this invention is exposed to a suitable source of exposing radiation depending upon the radiation absorber present in the negative-working radiation-sensitive composition to provide specific sensitivity that is at a wavelength of at least 150 nm and up to and including 450 nm ("UV" or "violet") or infrared of at least 700 nm and up to and including 1400 nm. In some embodiments, imagewise exposure is carried out using radiation having a $\lambda_{max}$ within the range of at least 350 nm and up to and including 450 nm when the negative-working lithographic printing plate precursor is sensitive to UV or "violet" radiation, or using radiation having a $\lambda_{max}$ within the range of at least 700 nm and up to and including 1400 nm using an appropriate energy source when the negative-working lithographic printing plate precursor is sensitive to infrared radiation.

Thus, in some embodiments of the method of this invention, the negative-working lithographic printing plate precursor is sensitive to infrared radiation and it is imagewise exposed using infrared radiation at a wavelength of at least 700 nm and up to and including 1400 nm.

In other embodiments of the method of this invention, the negative-working lithographic printing plate precursor is sensitive to radiation having a wavelength of at least 350 nm and up to and including 450 nm, and it is imagewise exposed using radiation at a wavelength of at least 350 and up to and including 450 nm.

For example, imaging can be carried out using imaging or exposing radiation from a radiation-generating laser (or array of such lasers). Imaging also can be carried out using imaging radiation at multiple wavelengths at the same time if desired. The laser used to expose the negative-working lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the negative-working lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the negative-working imageable layer. With these platesetters, any imaging parameters such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using such as stepwise imaged lithographic printing plate precursor, a shortened printing run is possible and the obtained prints are also useful for determining such imaging parameters.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 150 nm and up to and including 475 nm), can be carried out generally using energies of at least 0.01 mJ/cm$^2$ and up to and including 0.5 mJ/cm$^2$, and typically at least 0.02 mJ/cm$^2$ and up to and including about 0.1 mJ/cm$^2$. It would be desirable, for example, to image the UV/visible radiation-sensitive precursors at a power density in the range of at least 0.5 kW/cm$^2$ and up to and including 50 kW/cm$^2$ and typically of at least 5 kW/cm$^2$ and up to and including 30 kW/cm$^2$, depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

After imaging, the imaged negative-working lithographic printing plate precursors can be processed "off-press" using a suitable processing solution described herein, for example using water or a processing solution as described below. Such processing is carried out with imaged negative-working precursors for a time sufficient to remove the non-exposed regions of the imaged negative-working imageable layer and outermost water-soluble overcoat layer, if present, to reveal the hydrophilic surface of the substrate, but not long enough to remove significant amounts of the exposed regions that have been hardened. The revealed hydrophilic substrate surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Development off-press can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a suitable processing solution or developer (described below), and followed by rinsing with water. "Dip" development involves dipping the imaged precursor in a tank or tray containing the appropriate developer for at least 10 seconds and up to and including 60 seconds (especially at least 20 seconds and up to and including 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged precursor is contacted with the developer in an appropriate manner. The apparatus can also include a suitable rubbing mechanism (for example a brush or roller) and a suitable number of conveyance rollers. Some developing apparatus include laser exposure means and the apparatus is divided into an imaging section and a developing section.

Both aqueous alkaline developers and organic solvent-containing developers or processing solutions can be used. Some useful developer solutions are described for example, in U.S. Pat. No. 7,507,526 (Miller et al.) and U.S. Pat. No. 7,316,894 (Miller et al.). Developer solutions can include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates).

Useful alkaline aqueous developer solutions include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company)

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of at least 0.5% and up to and including 15% based on total developer weight. The organic solvent-containing developers can be neutral, alkaline, or slightly acidic in pH, and typically, they are alkaline in pH. Representative organic solvent-containing developers include ND-1 Developer, Developer 980, Developer 1080, Developer 1090, 2 in 1 Developer, 955 Developer, D29 Developer (described below), Developer SP500, Developer 206, and 956 Developer (all available from Eastman Kodak Company).

In some useful embodiments of the method of this invention, the processing solution used for development has a pH of at least 3 and up to and including 13, and typically, the pH is at least 6 and up to and including 12.5 or at least 7.5 and up to and including 11.5. In addition, the processing solution can further comprise at least one compound selected from the group consisting of a nonionic surfactant, an anionic surfactant, a neutrally-charged hydrophilic compound other than a nonionic or anionic surfactant, and a hydrophilic film-forming polymer. The presence of a hydrophilic film-forming polymer (as described below) can be particularly useful in some developer solutions. Such processing solutions an also comprise one or more alkanolamines, organic solvents, organic phosphonic acids, or polycarboxylic acids or salts.

In some instances, an aqueous processing solution can be used to both develop the imaged precursor by removing the non-exposed regions of the negative-working imageable layer and also to provide a protective overcoat layer or coating over the entire imaged and developed (processed) precursor printing surface. In this embodiment, the aqueous alkaline solution behaves somewhat like a gum that is capable of protecting (or "gumming") the lithographic image on the printing plate against contamination or damage (for example, from oxidation, fingerprints, dust, or scratches). Such processing solutions generally have a pH of at least 2 and up to and including 11.5, and typically of at least 6 and up to and including 11, or of at least 6 and up to and including 10.5, as adjusted using a suitable amount of an acid or base. The aqueous processing solution generally includes a basic compound such as an organic amine having a boiling point of less than 300° C. (and typically of at least 50° C.) or an alkaline earth/alkali carbonate buffer or an amino acid buffer, a film-forming hydrophilic polymer, and optionally an anionic, amphoteric, or nonionic surfactant. The pH of the aqueous alkaline solution can be adjusted by adding a suitable amount of a alkaline component such as alkali silicates (including metasilicates), alkali metal hydroxides (such as sodium hydroxide and potassium hydroxide), and quaternary ammonium hydroxides. Tap water can be used to make up the solution and generally provides at least 45 and up to and including 98 weight % of the solution.

Useful organic amines are relatively volatile organic primary, secondary, and tertiary amines that include but are not limited to, alkanolamines (including cycloalkyl amines), carbocyclic aromatic amines, and heterocyclic amines, that are present in a total amount of at least 0.1 weight % and up to and including 50 weight %. Useful amines are mono-, di- and trialkanol amines such as monoethanolamine, diethanolamine, triethanolamine, and mono-n-propanolamine, or combinations of these compounds.

One or more film-forming water-soluble or hydrophilic compounds can be present in the processing solution in an amount of at least 0.25 weight % and up to and including 30 weight % and typically at least 1 weight % and up to and including 15 weight %. Examples of useful hydrophilic compounds of this type include hydrophilic polymers as well as non-polymeric hydrophilic compounds (molecular weight of less than 1,000) that are not nonionic or anionic surfactants. Useful non-polymeric and polymeric hydrophilic compounds include but are not limited to, gum arabic, gluconic acid, pullulan, cellulose derivatives (such as hydroxymethyl celluloses, carboxymethyl-celluloses, carboxyethylcelluloses, and methyl celluloses), starch derivatives [such as (cyclo) dextrins, starch esters, dextrins, carboxymethyl starch, and acetylated starch] poly(vinyl alcohol), poly(vinyl pyrrolidone), polyhydroxy compounds [such as polysaccharides, sugar alcohols such as sorbitol, miso-inosit, homo- and copolymers of (meth)acrylic acid or (meth)acrylamide], copolymers of vinyl methyl ether and maleic anhydride, copolymers of vinyl acetate and maleic anhydride, copolymers of styrene and maleic anhydride, and copolymers having recurring units with carboxy, sulfo, or phospho groups, or salts thereof.

The aqueous processing solution optionally includes one or more anionic, amphoteric, or nonionic surfactants (or both) in an amount of at least 0.25 weight % and up to and including 50 weight %, and typically at least 0.25 weight % and up to and including 30 weight %. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include salts of fatty acids, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylene-alkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

Examples of useful nonionic surfactants include but are not limited to, polyoxyethylene alkyl ethers, polyoxyethylene phenyl ethers, polyoxyethylene 2-naphthyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycol-aliphatic esters, partial esters of poly-glycerinaliphatic acids, poly-oxyethylenated castor oils, partial esters of polyoxyethyleneglycerinaliphatic acids, aliphatic diethanolamides, N,N-bis-2-hydroxyalkylamines, polyoxy-ethylene alkylamines, triethanolamine aliphatic esters, alkoxylated aromatic compounds and trialkylamine oxides. Particularly preferred among these nonionic surfactants are alkoxylated aromatic compounds like polyoxyethylene phenyl ethers, polyoxyethylene-2-naphthyl ethers as disclosed in EP 1,172,699A (Tsuchiya et al.), polyoxyethylene di-styryl phenyl ether and polyoxyethylene tri-styryl phenyl ether as disclosed in EP 1,722,275A (Gries et al.).

Useful amphoteric surfactants include but are not limited to, N-alkylamino acid triethanol ammonium salts, cocamidopropyl betaines, cocamidoalkyl glycinates, sodium salt of a short chain alkylaminocarboxylate, N-2-hydroxyethyl-N-2-carboxyethyl fatty acid amidoethylamine sodium salts, and carboxylic acid amidoetherpropionates; preferred are cocamidopropylbetaines.

Useful cationic surfactants include but are not limited to, tetraalkyl ammonium chlorides such as tetrabutyl ammonium chloride and tetramethyl ammonium chloride, and polypropoxylated quaternary ammonium chlorides.

Additional optional components of the aqueous processing solutions useful in this invention include but are not limited to, antifoaming agents, buffers, biocides, complexing agents, and small amounts of water-miscible organic solvents such as reaction products of phenol with ethylene oxide and propylene oxide, benzyl alcohol, esters of ethylene glycol and propylene glycol with acids having 6 or less carbon atoms, sludge inhibitors (such as filter dyes and free-radical inhibitors), odorants, anti-corrosion agents, and dyes.

The processing solution (or developer) can be applied to an imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator. For example, the imaged precursor can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). As noted above, the imaged precursor can be immersed in the processing solution and rubbed by hand or with an apparatus. To assist in the removal of the back side coating, a brush roller or other mechanical component can be placed in contact with the back side coating during processing. Alternatively, the processing solution can be sprayed using a spray bar using a sufficient force.

The processing solution can also be applied in a processing unit (or station) in a suitable apparatus that has at least one roller for rubbing or brushing the imaged precursor while the processing solution is applied. Residual processing solution can be removed (for example, using a squeegee or nip rollers) or left on the resulting lithographic printing plate without any rinsing step. Excess processing solution can be collected in a tank and used several times, and replenished if necessary from a reservoir. The processing solution replenisher can be of the same concentration as that used in processing, or it can be provided in concentrated form and diluted with water at an appropriate time.

After such processing, the lithographic printing plate can be mounted onto a printing press without any post-processing step, such as rinsing, gumming, or post-processing curing or UV treatment.

In some embodiments, the imaged lithographic printing plate precursor can be processed as described above, but before mounting onto a printing press, the resulting lithographic printing plate can be further treated by rinsing with water, an aqueous solution, or other suitable solution, gumming, or drying, or any combination of these procedures. In addition, such imaged precursors can be pre-heated prior to the processing step.

Following off-press development, the resulting lithographic printing plate can be postbaked with or without blanket or floodwise exposure to UV or visible radiation. Alternatively, a blanket UV or visible radiation exposure can be carried out, without a postbake operation.

Postbaking the imaged and processed lithographic printing plate can be carried out at a temperature of at least 180° C. for at least 10 seconds or at a temperature of at least 180° C. and up to and including 300° C. for at least 10 seconds and up to and including 10 minutes.

Thus, in some embodiments of the method of this invention, the imagewise exposed lithographic printing plate precursor can be develop off-press using an aqueous processing solution, followed by rinsing and gumming the lithographic printing plate prior to baking the lithographic printing plate.

In other embodiments, the developing can be carried out off press using an aqueous processing solution without any following rinsing and gumming the lithographic printing plate, following by baking the lithographic printing plate at a temperature of at least 180° C. for at least 10 seconds.

In some embodiments, there is no post-development rinsing or gumming, but the lithographic printing plates can be used for printing without these common steps.

Printing can be carried out by putting the imaged and developed lithographic printing plate on a suitable printing press. The lithographic printing plate is generally secured in the printing plate using suitable clamps or other holding devices. Once the lithographic printing plate is secured in the printing press, printing is carried out by applying a lithographic printing ink and fountain solution to the printing surface of the lithographic printing plate. The fountain solution is taken up by the surface of the hydrophilic substrate revealed by the imaging and processing steps, and the ink is taken up by the remaining regions of the imageable layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material (for example, sheets of paper). The lithographic printing plates can be cleaned between impressions, if desired, using conventional cleaning means.

For the imaged negative-working lithographic printing plate precursors that are designed for on-press development, the imaged precursor is mounted on-press wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The present invention provides at least the following embodiments and combinations thereof, but other combinations of features are considered to be within the present invention as a skilled artisan would appreciate from the teaching of this disclosure:

1. A negative-working lithographic printing plate precursor comprising a substrate and having thereon a negative-working imageable layer comprising:

a free radically polymerizable component, an initiator composition capable of generating free radicals upon exposure to radiation, a radiation absorber, and a polymeric binder comprising a polymeric backbone and further comprising at least (a) and (b) pendant groups distributed in random order along the polymeric backbone, the (a) and (b) pendant groups being identified as follows:

(a) pendant groups comprising ethylenically unsaturated polymerizable groups, and (b) pendant groups comprising one or more groups represented by following Structures (I), (II), and (III):

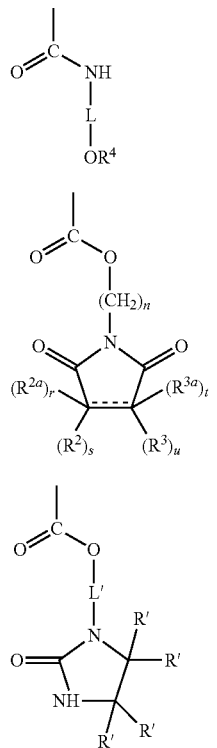

wherein:

each R' is independently hydrogen, or a substituted or unsubstituted alkyl or a substituted or unsubstituted aryl group, $R^2$, $R^{2a}$, $R^3$, and $R^{3a}$ are independently hydrogen or a substituted or unsubstituted alkyl group, or $R^2$ and $R^3$ or $R^{2a}$ and $R^{3a}$, together with the two carbon atoms to which they are bonded, form a substituted or unsubstituted aryl group, substituted or unsubstituted heteroaryl group, or a substituted or unsubstituted carbocyclic or heterocyclic group, $R^4$ is hydrogen or a substituted or unsubstituted alkyl group, L and L' are independently divalent substituted or unsubstituted linking groups, n is 0 or 1, r, s, t, and u are independently 0 or 1 provided that one of r and s is 0 if the carbon atom to which $R^2$ and $R^{2a}$ are bonded is part of —C=C— double bond, and further provided that one of t and u is 0 if the carbon atom to which $R^3$ and $R^{3a}$ are bonded is part of a —C=C— double bond, and the dotted line in Structure II indicates that a double bond may or may not be present, wherein the (a) pendant groups are present in an amount of at least 0.5 mmol/g of the polymeric binder and up to and including 7 mmol/g of the polymeric binder and the (b) pendant groups are present in an amount of at least 0.5 mmol/g of the polymeric binder and up to and including 7 mmol/g of the polymeric binder.

2. The negative-working lithographic printing plate precursor of embodiment 1, wherein the polymeric binder comprises a polyurethane backbone, polyester backbone, polyamide backbone, polyvinyl acetal backbone, or a polyacrylic backbone.

3. The negative-working lithographic printing plate precursor of embodiment 1 or 2, wherein the polymeric binder comprising a polymeric backbone having the following recurring units arranged in random order along the backbone:

same or different -A- recurring units comprising pendant groups comprising ethylenically unsaturated polymerizable groups, same or different —B— recurring units represented by following Structures (Ia), (IIa), or (IIIa):

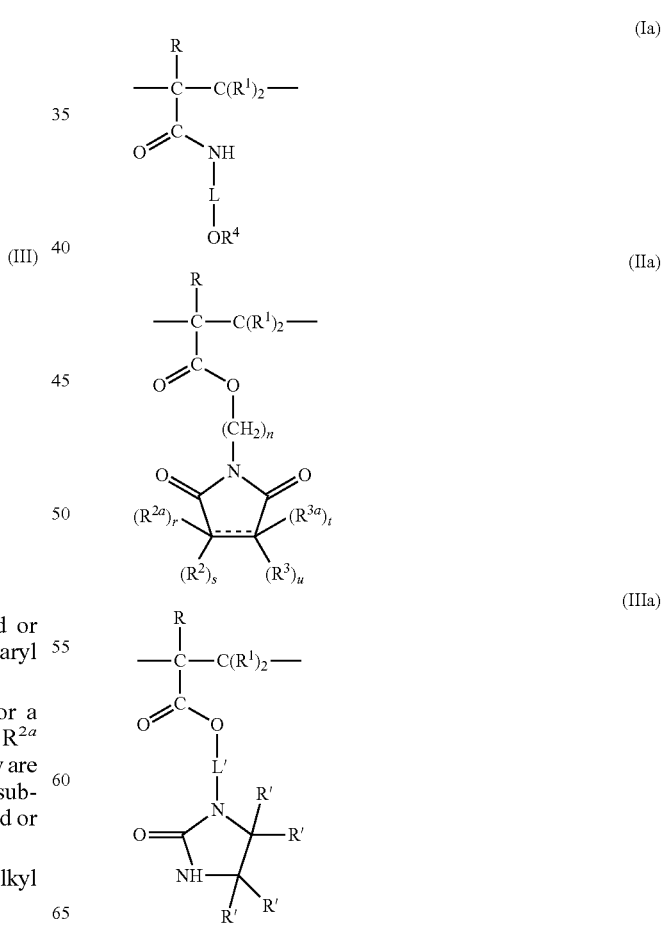

wherein each of R and $R^1$ is independently hydrogen, cyano, a substituted or unsubstituted alkyl group, or a halogen, and optionally, same or different —C— recurring units that are different from the -A- and —B— recurring units.

4. The negative-working lithographic printing plate precursor of any of embodiments 1 to 3, wherein the (a) pendant groups are present in an amount of at least 1 mmol/g of the polymeric binder and up to and including 4 mmol/g of the polymeric binder and the (b) pendant groups are present in an amount of at least 1 mmol/g of the polymeric binder and up to and including 4 mmol/g of the polymeric binder.

5. The negative-working lithographic printing plate precursor of any of embodiment 3 or 4, wherein the polymeric binder comprises -A- recurring units in an amount of at least 30 mol % and up to and including 70 mol %, —B— recurring units in an amount of at least 20 mol % and up to and including 70 mol %, and —C— recurring units in an amount of at least 10 mol % and up to and including 40 mol %, all based on the total recurring units in the polymeric binder.

6. The negative-working lithographic printing plate precursor of any of embodiments 3 to 5, wherein the polymeric binder further comprises pendant groups selected from the group consisting of —C(=O)—NH$_2$, acidic, and —[(CH$_2$—CR$_y$—O)]$_m$—R$_x$ groups, wherein R$_y$ and R$_x$ are independently hydrogen or methyl, and m is at least 1 and up to and including 20, and the total amount of the (c) pendant groups is at least 0.2 mmol/g of the polymeric binder and up to and including 4 mmol/g of the polymeric binder.

7. The negative-working lithographic printing plate precursor of any of embodiments 3 to 6, wherein the polymeric binder comprises:

-A- recurring units that are derived from allyl (meth)acrylate,

—B— recurring units represented by Structure (Ia) wherein $R^4$ is hydrogen or a substituted or unsubstituted alkyl having 1 to 4 carbon atoms, and L is methylene, and —C— recurring units that comprise a pendant —C(=O)—NH$_2$, acidic, or —[(CH$_2$—CR$_y$—O)]$_m$—R$_x$ group, wherein R$_y$ and R$_x$ are independently hydrogen or methyl, and m is from 1 and up to and including 20.

8. The negative-working lithographic printing plate precursor of any of embodiments 1 to 7, wherein the radiation absorber is either:

an infrared radiation absorber that effectively absorbs infrared radiation at a wavelength of at least 700 nm and up to and including 1400 nm, or a sensitizer that effectively absorbs radiation at a wavelength of at least 350 nm and up to and including 450 nm.

9. The negative-working lithographic printing plate precursor of any of embodiments 1 to 8, wherein the polymeric binder comprises recurring units derived from each of allyl (meth)acrylate, an alkoxymethyl methacrylamide, and (meth)acrylic acid, wherein:

the recurring units derived from allyl (meth)acrylate are present in an amount of at least 0.5 mmol/g of the polymeric binder and up to and including 7 mmol/g of the polymeric binder, the recurring units derived from alkoxymethyl methacrylamide are present in an amount of at least 0.5 mmol/g of the polymeric polymer and up to and including 7 mmol/g or the polymeric binder, and the recurring units derived from (meth)acrylic acid are present in an amount of at least 0.2 mmol/g of the polymeric binder and up to and including 4 mmol/g of the polymeric binder.

10. The negative-working lithographic printing plate precursor of any of embodiments 1 to 9, wherein the polymeric binder is present in the negative-working imageable layer in an amount of at least 20 weight % and up to and including 80 weight %, based on total dry weight of the negative-working imageable layer.

11. The negative-working lithographic printing plate precursor of any of embodiments 3 to 10, wherein the polymeric binder comprises -A- recurring units in an amount of at least 30 mol % and up to and including 70 mol %, —B— recurring units in an amount of at least 20 mol % and up to and including 70 mol %, and —C— recurring units in an amount of at least 10 mol % and up to and including 40 mol %, all based on the total recurring units in the polymeric binder, the —B— recurring units being represented by Structure (Ia), (IIa), or (IIIa) wherein:

each of R and $R^1$ is independently hydrogen, cyano, or methyl, each R' is independently hydrogen, methyl, ethyl, or phenyl, $R^2$, $R^{2a}$, $R^3$, and $R^{3a}$ are independently hydrogen or a substituted or unsubstituted alkyl group having 1 to 6 carbon atoms, or $R^2$ and $R^3$ or $R^{2a}$ and $R^{3a}$, together with the two carbon atoms to which they are bonded, form a substituted or unsubstituted phenyl group, substituted or unsubstituted heteroaryl group, or a substituted or unsubstituted cycloalkyl group, $R^4$ is hydrogen or a substituted or unsubstituted alkyl group having 1 to 6 carbon atoms, and —C— recurring units that comprise a pendant —C(=O)—NH$_2$, acidic, or —[(CH$_2$—CR$_y$—O)]$_m$—R$_x$ group, wherein R$_y$ and R$_x$ are independently hydrogen or methyl, and m is from 1 and up to and including 20.

12. The negative-working lithographic printing plate precursor of embodiment 11, wherein the polymeric binder comprises -A- recurring units derived from allyl (meth)acrylate, —B— recurring units represented by Structure (Ia) wherein $R^4$ is hydrogen or a substituted or unsubstituted alkyl group having 1 to 4 carbon atoms and L is methylene, and —C— recurring units derived from (meth)acrylic acid.

13. A method for making a lithographic printing plate comprising:

imagewise exposing the negative-working lithographic printing plate precursor of any of embodiments 1 to 12 to imaging radiation to provide exposed regions and non-exposed regions in the negative-working imageable layer, and developing the imagewise exposed precursor to remove the non-exposed regions of the negative-working imageable layer using a processing solution to provide a lithographic printing plate.

14. The method of embodiment 13, wherein negative-working lithographic printing plate precursor is sensitive to infrared radiation and the imagewise exposing is carried out using infrared radiation at a wavelength of at least 700 nm and up to and including 1400 nm.

15. The method of embodiment 13, wherein negative-working lithographic printing plate precursor is sensitive to radiation having a wavelength of at least 350 nm and up to and including 450 nm, and the imagewise exposing is carried out using radiation at a wavelength of at least 350 nm and up to and including 450 nm.

16. The method of any of embodiments 13 to 15, further comprising after the developing, baking the lithographic printing plate at a temperature of at least 180° C. for at least 10 seconds.

17. The method of embodiment 16, wherein the developing is carried out off-press using an aqueous processing solution, followed by rinsing and gumming the lithographic printing plate prior to baking the lithographic printing plate.

18. The method of any of embodiments 13 to 17, wherein the developing is carried out off-press using an aqueous processing solution without any following rinsing and gumming the lithographic printing plate, following by baking the lithographic printing plate at a temperature of at least 180° C. for at least 10 seconds.

The following Examples are provided to illustrate the practice of this invention and are not meant to be limiting in any manner.

The following materials were used in preparing and carrying out the Examples:

| | |
|---|---|
| Aerodisp ® 1030 | 30 weight % dispersion of surface modified silica particles in methoxypropylacetate (EVONIK, Germany) |
| AMA | Allyl methacrylate |
| Binder 1 | Polymer derived from methacrylic side groups corresponding to polymer P-2 in EP 1,344,783A1 |

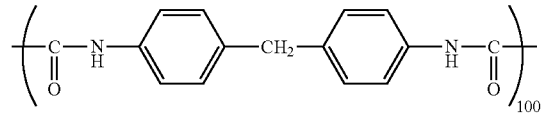

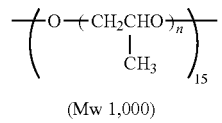

(Mw 1,000)

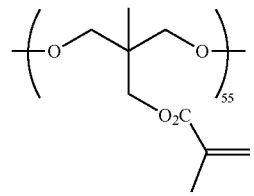

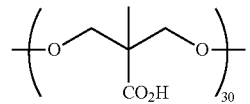

| | |
|---|---|
| Binder 15 | Copolymer B described in U.S. 2010-028806A1 |
| Binder 16 | Copolymer VP7 described in WO 2007/121871 |
| BLO | γ-Butyrolactone |
| BYK ® 307 | Polyethoxylated dimethyl polysiloxane (BYK Chemie) |
| BzMA | Benzyl methacrylate |
| Dowanol EPH | Phenoxyethanol |
| Emulsogen TS160 | 2,4,6-Tri(1-phenylethyl)-phenol polyglycol ether with 16 EO units (Clariant) |
| Foam Ban HV825 G | Antifoam based on polyalkylene glycol (Muenzing) |
| Hybridur ® 580 | Polyurethane acrylic hybrid dispersion in water (40% solids, Air Products & Chemicals) |
| IPMA | N-isopropyl methacrylamide |
| IR Dye 1 | 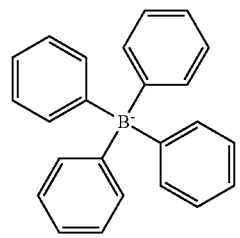 [SMILES: c1ccc([B-](c2ccccc2)(c2ccccc2)c2ccccc2)cc1] |

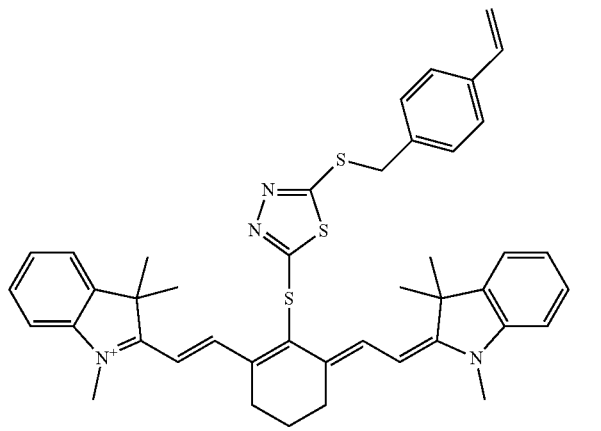 [SMILES: C=Cc1ccc(CSc2nnc(SC3=C(/C=C/C4=[N+](C)c5ccccc5C4(C)C)CCC/C3=C\C=C3\N(C)c4ccccc4C3(C)C)s2)cc1]

IR Dye 2

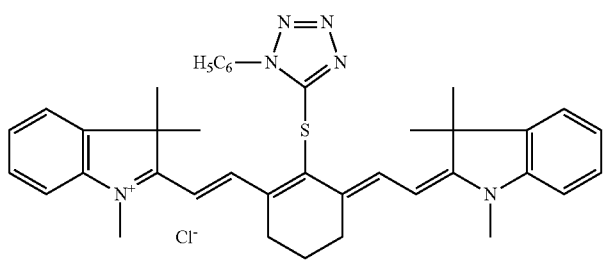

| | |
|---|---|
| Lutensol ® TO109 | Ethoxylated (10 EO units) $C_{13}$-alcohol (BASF Corporation) |
| MAA | Methacrylic acid |
| MEK | Methyl ethyl ketone |
| Monomer 1 | Urethane methacrylate made from glycerol dimethacrylate, glycerol monomethacrylate, propylene glycol methacrylate, and biuret of hexamethylene diisocyanate corresponding to oligomer m1 in EP 1,969,426B1 |
| Sipomer PAM-100 | Phosphate functionalized methacrylate with polyalkylene oxide spacer (Rhodia, France) |
| Kayamer PM-2 | Ester of hydroxyethyl methacrylate and phosphoric acid (Siber Hegner) |
| N-BMAA | N-butoxymethyl methacrylamide |
| N-HMAA | N-hydroxymethyl acrylamide |
| N-MMMA | N-methoxymethyl methacrylamide |
| M-NHP | 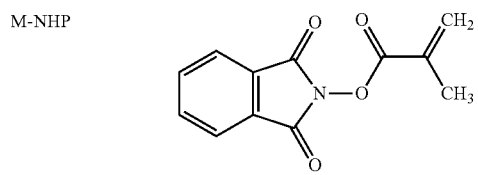 |
| Mowiol 4-98 | |
| NK Ester BPE 500 | Ethoxylated Bisphenol A dimethacrylate (Shin Nakamura) |
| PGME | Propylene glycol monomethyl ether |
| Pigment 1 | Dispersion in propylene glycol monomethyl ether containing 9 weight % of copper phthalocyanine and 1 weight % of a poly(vinyl acetal) binder having recurring units: 39.9 mol % from vinyl alcohol, 1.2 mol % from vinyl acetate, 15.4 mol % acetal groups from acetaldehyde, 36.1 mol % acetal groups from butyraldehyde, and 7.4 acetal groups from 4-formylbenzoic acid |
| Pigment 2 | Dispersion in propylene glycol monomethyl ether containing 9 weight % of halogen blue 7565 and 4 weight % of a poly(vinyl acetal) binder having recurring units: 39.9 mol % from vinyl alcohol, 1.2 mol % from vinyl acetate, 15.4 mol % of acetal groups from acetaldehyde, 36.1 mol % of acetal groups from butyraldehyde, and 7.4 acetal groups from 4-formylbenzoic acid |

| | |
|---|---|
| PVA-403 | Polyvinyl alcohol having saponification value 80% (Kuraray) |
| PVP K-15 | Poly(vinyl pyrrolidone) (ISP, USA) |
| Sensitizer 1 | 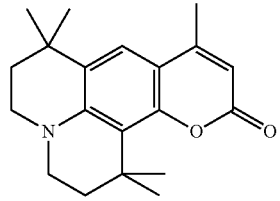 [SMILES: Cc1cc(=O)oc2c3c4c(cc12)C(C)(C)CCN4CCC3(C)C] |
| SR399 | Dipentaerythritol pentaacrylate (Sartomer) |
| Surfynor ® 440 | Ethoxylated 2,4,7,9-tetramethyl-5-decyn-4,7-diol (Air Products & Chemicals) |
| Texapon 842 | Sodium octylsulfate |

Preparation of Inventive Polymeric Binders:

To a 12 weight % solution of the monomer mixtures described in the following TABLE I (theoretical amounts) in MEK were added 0.6 mol % of AIBN and 0.5 mol % of dodecyl mercaptan. The resulting mixtures were flashed with nitrogen and then heated to 70° C. for 8 hours under stirring. About 50% of the MEK was distilled off under vacuum at 30° C. The resulting binders were isolated by dropping the solution into a double amount of petrol ether with respect to the amount of MEK used for the reaction. The polymers were dried under vacuum at 35° C. for 24 hours.

TABLE I

| Binder 2 | MAA | 20 mol % |
|---|---|---|
| | AMA | 40 mol % |
| | BzMA | 20 mol % |
| | IPMA | 20 mol % |
| Binder 3 | MAA | 20 mol % |
| | AMA | 60 mol % |
| | BzMA | 20 mol % |
| Binder 4 | MAA | 20 mol % |
| | AMA | 60 mol % |
| | N-MMMA | 20 mol % |
| Binder 5 | MAA | 20 mol % |
| | AMA | 50 mol % |
| | N-MMMA | 30 mol % |
| Binder 6 | MAA | 20 mol % |
| | AMA | 40 mol % |
| | BzMA | 20 mol % |
| | N-MMMA | 20 mol % |
| Binder 7 | MAA | 20 mol % |
| | AMA | 40 mol % |
| | N-MMMA | 40 mol % |
| Binder 8 | MAA | 20 mol % |
| | AMA | 20 mol % |

TABLE I-continued

| | BzMA | 20 mol % |
|---|---|---|
| | N-MMMA | 40 mol % |
| Binder 9 | MAA | 20 mol % |
| | AMA | 30 mol % |
| | N-MMMA | 50 mol % |
| Binder 10 | MAA | 21 mol % |
| | AMA | 69 mol % |
| | M-NHP | 10 mol % |
| Binder 11 | MAA | 23 mol % |
| | AMA | 57 mol % |
| | M-NHP | 20 mol % |
| Binder 12 | MAA | 25 mol % |
| | AMA | 45 mol % |
| | M-NHP | 30 mol % |
| Binder 13 | MAA | 20 mol % |
| | AMA | 50 mol % |
| | N-HMAA | 30 mol % |
| Binder 14 | MAA | 20 mol % |
| | AMA | 50 mol % |
| | N-BMAA | 30 mol % |

Preparation of IR-Sensitive Negative-Working Lithographic Printing Precursors:

An electrochemically roughened and anodized aluminum foil with an oxide weight of 2.75 g/m² was subjected to an after-treatment using an aqueous solution of polyvinyl phosphoric acid). The average roughness of the resulting substrate surface was 0.55 μm.

Negative-working imageable layer coating compositions were prepared using the components described below in TABLE II and applied to the samples of the noted substrate after filtering using a wire bar coater. Each of the resulting coatings was dried for 4 minutes at 90° C. to provide a dry coating weight of 1.2 g/m² for each resulting negative-working imageable layer.

TABLE II

Negative-working Imageable Layer Compositions Having Sensitivity at 830 nm

| | Invention Example | | | | | | | | | | |
|---|---|---|---|---|---|---|---|---|---|---|---|
| | 1 | 2 | 3 | 4 | 5 | 6 | 7 | 8 | 9 | 10 | 11 |
| Solvent mixture containing 21.84 weight % MEK, 71 weight % PGME, and 8.73 weight % BLO | 45 g | 45 g | 45 g | 45 g | 45 g | 45 g | 45 g | 45 g | 45 g | 45 g | 45 g |

TABLE II-continued

Negative-working Imageable Layer Compositions Having Sensitivity at 830 nm

| | | | | | | | | | | | |
|---|---|---|---|---|---|---|---|---|---|---|---|
| 40 weight % solution of SR399 in PGME | 5.77 g | 5.77 g | 5.77 g | 5.77 g | 5.77 g | 5.77 g | 5.77 g | 5.77 g | 5.77 g | 5.77 g | 6.03 g |
| Aerodisp ® 1030 | 2.05 g | 2.05 g | 2.05 g | 2.05 g | 2.05 g | 2.05 g | 2.05 g | 2.05 g | 2.05 g | 2.05 g | |
| Hybridur 580 | | | | | | | | | | | 0.75 g |
| Sipomer PAM-100 | 0.274 g | 0.274 g | 0.274 g | 0.274 g | 0.274 g | 0.274 g | 0.274 g | 0.274 g | 0.274 g | 0.274 g | 0.274 g |
| Kayamer PM-2 | | | | | | | | | | | |
| Polymeric binder | 6 | 7 | 8 | 4 | 5 | 10 | 11 | 12 | 9 | 6 | 6 |
| | 1.95 g | 1.95 g | 1.95 g | 1.95 g | 1.95 g | 1.95 g | 1.95 g | 1.95 g | 1.95 g | 1.95 g | 2.03 g |
| Bis(4-t-butyl-phenyl)iodonium tetraphenyl borate | 0.461 g | 0.461 g | 0.461 g | 0.461 g | 0.461 g | 0.461 g | 0.461 g | 0.461 g | 0.461 g | | 0.461 g |
| Bis(4-cumyl)iodonium tetraphenyl borate | | | | | | | | | | 0.461 g | |
| IR Dye 1 | 0.137 g | 0.137 g | 0.137 g | 0.137 g | 0.137 g | 0.137 g | 0.137 g | 0.137 g | 0.137 g | 0.137 g | 0.137 g |
| IR Dye 2 | | | | | | | | | | | |
| Pigment 1 | 3.69 g | 3.69 g | 3.69 g | 3.69 g | 3.69 g | 3.69 g | 3.69 g | 3.69 g | 3.69 g | 3.69 g | 3.69 g |
| 20 weight % solution of BYK ® 307 in PGME | 0.195 g | 0.195 g | 0.195 g | 0.195 g | 0.195 g | 0.195 g | 0.195 g | 0.195 g | 0.195 g | 0.195 g | 0.195 g |

| | Example | | | | | | | | |
|---|---|---|---|---|---|---|---|---|---|
| | Invention 12 | Invention 13 | Invention 14 | Invention 15 | Comparative 1 | Comparative 2 | Comparative 3 | Comparative 4 | Comparative 5 |
| Solvent mixture containing 21.84 weight % MEK, 71 weight % PGME, and 8.73 weight % BLO | 45 g | 45 g | 45 g | 45 g | 45 g | 45 g | 45 g | 45 g | 45 g |
| 40 weight % solution of SR399 in PGME | 5.77 g | 5.77 g | 6.03 g | 6.03 g | 5.77 g | 5.77 g | 5.77 g | 5.77 g | 5.77 g |
| Aerodisp ® 1030 | 2.05 g | 2.05 g | | | 2.05 g | 2.05 g | 2.05 g | 2.05 g | 2.05 g |
| Hybridur ® 580 | | | 0.75 g | 0.75 g | | | | | |
| PAM-100 | | 0.274 g | 0.274 g | 0.274 g | 0.274 g | 0.274 g | 0.274 g | 0.274 g | 0.274 g |
| Kayamer PM-2 | 0.1 g | | | | | | | | |
| Polymeric binder | 6 | 6 | 13 | 14 | 2 | 3 | 1 | 15 | 16 |
| | 1.95 g | 1.95 g | 2.03 g | 2.03 g | 1.95 g | 1.95 g | 1.95 g | 1.95 g | 1.95 g |
| Bis(4-t-butylphenyl)iodonium tetraphenyl borate | 0.461 g | 0.461 g | 0.461 g | 0.461 g | 0.461 g | 0.461 g | 0.461 g | 0.461 g | 0.461 g |
| Bis(4-cumyl)iodonium tetraphenyl borate | | | | | | | | | |
| IR Dye 1 | 0.137 g | | 0.137 g | 0.137 g | 0.137 g | 0.137 g | 0.137 g | 0.137 g | 0.137 g |
| IR Dye 2 | | 0.137 g | | | | | | | |
| Pigment 1 | 3.69 g | 3.69 g | 3.69 g | 3.69 g | 3.69 g | 3.69 g | 3.69 g | 3.69 g | 3.69 g |
| 20 weight % solution of BYK ® 307 in PGME | 0.195 g | 0.195 g | 0.195 g | 0.195 g | 0.195 g | 0.195 g | 0.195 g | 0.195 g | 0.195 g |

The following overcoat layer formulation in TABLE III was prepared and coated on top of each negative-working imageable layer described above in TABLE II. Each overcoat coating was dried for 4 minutes at 90° C. to provide a dry coating weight of 0.5 g/m² for each resulting negative-working lithographic printing plate precursor.

TABLE III

| Component | Amount |
|---|---|
| Water | 859 g |
| PVA-403 | 21.5 g |
| Lutensol ® TO109 | 0.5 g |
| Surfynol ® 440 | 0.05 g |

Exposure, Processing, and Measurement of the "Sum of the Tonal Values":

The UGRA/FOGRA Postscript Strip version 2.0 EPS (available from UGRA), which contains different elements for evaluating the quality of the copies, was used for imaging the lithographic printing plate precursors of the Invention Examples and Comparative Examples using a Trendsetter 3244 (Eastman Kodak) at 830 nm and an exposure energy of 80 mJ/cm².

The imaged lithographic printing plate precursors were developed (processed) using Developer 1 (see below) in a Kodak Thermal processor using the following processor settings: developer temperature 23° C., top up rate 40 ml/m², post rinse section with water recirculation, and gumming section filled with Kodak 850S gumming solution.

The "sum of the tonal values" was used as a measure of the photospeed of the imaged and developed lithographic printing plates. This parameter was calculated by adding the measured tonal values of 5%, 10%, 20%, 30%, 40%, 50%, 60%, 70%, 80%, 90%, and 95% nominal targets at 150 lpi.

Developer 1 (pH of 10.2):

| | |
|---|---|
| Water | 732.9 g |
| Emulsogen TS160 | 18.0 g |
| Texapon 842 (40 wt. %) | 122.5 g |
| Dowanol EPH | 75.0 g |
| Diethanolamine | 50 g |

| | |
|---|---|
| Citric acid monohydrate | 2.0 g |
| Foam Ban HV 825G | 0.2 g |

Shelf Life Testing:

For an estimation of the shelf life, the lithographic printing plate precursors were subjected to an accelerated aging test in a climate chamber at 40° C. and 80% RH without wrapping paper for 2, 5, 7, and 10 days, respectively. After imagewise exposure and processing as described above, each lithographic printing plate was loaded into a sheet-fed offset printing machine using abrasive lithographic printing ink (Offset S 7184 available from Sun Chemical which contains 10% of calcium carbonate) and fountain solution (Boettcher Fount 5-3021 available from Boettcher GmbH.) for printing. The non-image areas were checked for ink receptivity to evaluate shelf life as follows:

+ Plate printed cleanly after 15 printed sheets;

0 Plate printed cleanly after 30 printed sheets;

- Plate printed cleanly after 60 printed sheets;

-- Plates did not print cleanly after 60 printed sheets.

Baking Test:

To evaluate bakeability, each lithographic printing plate was heated in an oven at 250° C. for 4 minutes. After each lithographic printing plate was cooled down to room temperature, drops of deletion fluid Kodak 231 were put onto each lithographic printing plate surface in a time interval of 1 minute until the first drop has a dwell time of 10 minutes and the last drop had a dwell time of 1 minute. Each lithographic printing plate was then rinsed with water and dried. The optical density (O.D.) was measured in the area where the drops had been applied, and a curve was constructed using the O.D. data versus contact time ($t_b$). The place on the curve where the O.D. dropped below 20% of the starting value was taken as a measure for bakeability. The higher the $t_b$ value at the measurement point, the better the baking efficiency of the lithographic printing plate.

General Method for Preparing Lithographic Printing Plate Precursors for 405 nm Exposure:

An electrochemically roughened and anodized aluminum foil with an oxide weight of 2.75 g/m² was subjected to an after-treatment (post-treatment) using an aqueous solution of poly(vinyl phosphoric acid). The average roughness of the treated surface was 0.55 μm.

Negative-working imageable layer coating compositions as defined below in TABLE V were applied to this treated substrate after filtering using a wire bar coater. Each applied coating was dried for 4 minutes at 90° C. to provide a dry coating weight of 1.6 g/m².

The following overcoat solution in TABLE IV was prepared and applied onto each dry negative-working layer described in TABLE V. The overcoat coating was dried for 4 minutes at 90° C. to provide a dry coating weight of 2 g/m².

TABLE IV

| Component | Amount |
|---|---|
| Water | 850 g |
| Mowiol 4-98 | 83 g |
| PVP K15 | 15 g |
| 30 weight % solution of Surfynol ® 440 in water | 0.82 g |
| Lutensol ® TO109 | 0.56 g |

Exposure, Processing, and Measurement of Sum of Tonal Values:

The UGRA/FOGRA Postscript Strip version 2.0 EPS (available from UGRA), which contains different elements for evaluating the quality of the copies, was used for imaging the lithographic printing plate precursors described for each of the Invention Examples and Comparative Examples using a commercial Heidelberg Prosetter at 405 nm. The exposure energy was 50 J/cm².

Each imaged lithographic printing plate precursor was developed (processed) using Developer 1 (described above) in a commercial processor Kodak P-LD using the following processor settings:

Preheat setting 115° C.,

Prewash section in circulation mode,

Developer temperature 23° C.,

Top up rate 40 ml/m²,

Post rinse section with water recirculation, and

Gumming section filled with commercial Kodak 850S gumming solution.

The sum of the total values was used as a measure of the photospeed of each imaged and developed lithographic printing plate. It is calculated by adding the measured tonal values of 5%, 10%, 20%, 30%, 40%, 50%, 60%, 70%, 80%, and 90% nominal targets at 150 lpi.

Shelf Life Testing:

For an estimation of shelf life, each lithographic printing plate precursor was subjected to an accelerated ageing test in a climate chamber at 40° C. and 80% RH wrapped in polyethylene-coated black paper for 5, 7, 10, and 12 days, respectively. Each of these "aged" lithographic printing plate precursors was imagewise exposed and processed as described above. Each lithographic printing plate was loaded in a sheet-fed offset printing machine using abrasive ink (Offset S 7184 available from Sun Chemical that contains 10 weight % of calcium carbonate) and fountain solution (Boettcher Fount S-3021 available from Boettcher GmbH.). The non-imaged areas on each lithographic printing plate were checked for ink receptivity and the following shelf life assessments were made:

+ Plate ran clean after 15 sheets;

0 Plate ran clean after 30 sheets;

- Plate ran clean after 60 sheets;

-- Plate was not clean after 60 sheets.

Baking Test:

The same procedure as described above for the 830 nm sensitive lithographic printing plate precursors was used.

Discussion of the Results:

The results for 830 nm exposed lithographic printing plate precursors shown below in TABLE VI and 405 nm exposed invention lithographic printing plate precursors shown in TABLE VII show that the polymeric binder used according to the present invention exhibited the same photosensitivity and shelf life as the Comparative lithographic printing plate precursors. However, the Invention precursors exhibited significantly improved bakeability.

TABLE V

| Imageable Layer Component | Invention Example 16 | Invention Example 17 | Comparative Example 6 | Comparative Example 7 |
|---|---|---|---|---|
| Solvent Mixture containing 90 weight % PGME and 10 weight % acetone | 30 g | 30 g | 30 g | 30 g |
| Polymer Binder | binder 5 | binder 5 | binder 2 | binder 2 |
|  | 1.39 g | 1.56 g | 1.39 g | 1.56 g |
| Pigment 1 | 2 g |  | 2 g |  |
| Pigment 2 |  | 1.97 g |  | 1.97 g |
| Kayamer PM-2 | 0.04 g | 0.015 g | 0.04 g | 0.015 g |
| Sipomer PAM-100 |  | 0.15 g |  | 0.15 g |
| Monomer 1 | 5.62 g | 6.69 g | 5.62 g | 6.69 g |
| NK Ester PBE 500 | 0.33 g | 0.42 g | 0.33 g | 0.42 g |
| 2-Phenyl-5-(4'-diethylaminophenyl)-4-(2-chlorophenyl)oxazole | 0.62 g |  | 0.62 g |  |
| Sensitizer 1 |  | 0.27 g |  | 0.27 g |
| 2,2-Bis-(2-chlorophenyl)-4,5,4',5'-tetraphenyl-2'H-[1,2]biimidazolyl | 0.15 g | 0.42 g | 0.15 g | 0.42 g |
| Mercaptotriazole | 0.28 g |  | 0.28 g |  |
| Mercaptobenzothiazole |  | 0.006 g |  | 0.006 g |
| Aerodisp ® 1030 | 1.25 g |  | 1.25 g |  |
| 1 weight % Solution of N-nitrosophenyl hydroxylamine aluminum salt in DEK | 0.65 g | 1.00 g | 0.65 g | 1.00 g |
| 20 weight % Solution of BYK ® 307 in PGME | 0.05 g | 0.05 g | 0.05 g | 0.05 g |

TABLE VI

Results of 830 nm Exposed Precursors

|  | Sum of the Tonal Values | Shelf Life | Baking Test $t_b$ [min] |
|---|---|---|---|
| Invention Example 1 | 564.2 | + | 9 |
| Invention Example 2 | 565.5 | + | 10 |
| Invention Example 3 | 562.7 | + | 10 |
| Invention Example 4 | 563.1 | + | 10 |
| Invention Example 5 | 565.0 | + | >10 |
| Invention Example 6 | 559.9 | + | 8 |
| Invention Example 7 | 558.8 | + | 7 |
| Invention Example 8 | 555.3 | + | 8 |
| Invention Example 9 | 564.0 | 0 | >10 |
| Invention Example 10 | 563.7 | + | 10 |
| Invention Example 11 | 565.1 | + | >10 |
| Invention Example 12 | 564.9 | + | 10 |
| Invention Example 13 | 563.0 | + | 9 |
| Invention Example 14 | 564.1 | 0 | >10 |
| Invention Example 15 | 564.8 | + | 8 |
| Comparative Example 1 | 563.3 | + | 3 |
| Comparative Example 2 | 560.8 | − | 3 |
| Comparative Example 3 | 564.1 | − | 3 |
| Comparative Example 4 | very weak image, assessment not possible | | |
| Comparative Example 5 | no image | | |

TABLE VII

Results of 405 nm Exposed Precursors

|  | Sum of the Tonal Values | Shelf Life | Baking Test $t_b$ {min] |
|---|---|---|---|
| Invention Example 16 | 566.6 | + | 6 |
| Invention Example 17 | 495.2 | + | 6 |
| Comparative Example 6 | 558.4 | + | 2 |
| Comparative Example 7 | 489.2 | + | 2 |

The invention has been described in detail with particular reference to certain preferred embodiments thereof, but it will be understood that variations and modifications can be effected within the spirit and scope of the invention.

The invention claimed is:

1. A negative-working lithographic printing plate precursor comprising a substrate and having thereon a negative-working imageable layer comprising:
a free radically polymerizable component,
an initiator composition capable of generating free radicals upon exposure to radiation,
a radiation absorber, and
a polymeric binder comprising a polymeric backbone and further comprising at least (a) and (b) pendant groups distributed in random order along the polymeric backbone, wherein the (a) and (b) pendant groups are identified as follows:
(a) pendant groups comprising ethylenically unsaturated polymerizable groups selected from vinyl ether, vital amine, allyl ether, allyl amine, (meth)acryl ester, (meth)acryl amide, and aryl vinyl groups, and
(b) pendant groups comprising one or more groups represented by following Structures (I), (II), and (III):

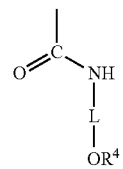
(I)

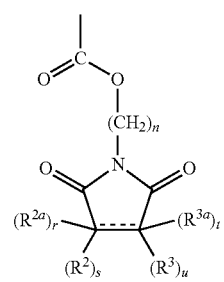
(II)

-continued

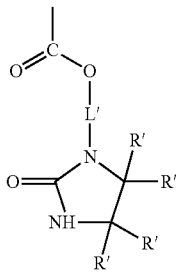
(III)

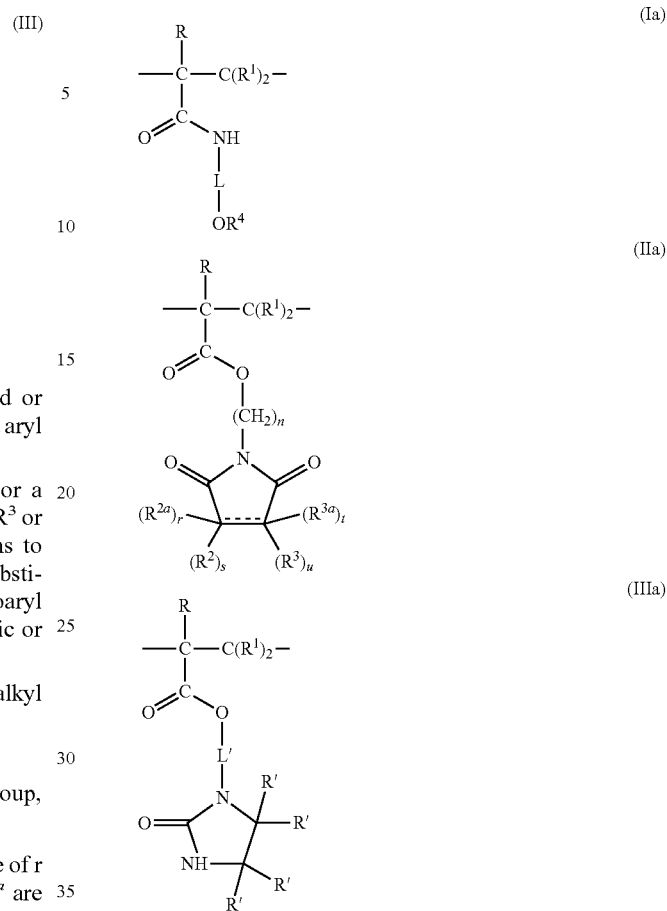

wherein:

each R' is independently hydrogen, or a substituted or unsubstituted alkyl or a substituted or unsubstituted aryl group, $R^2$, $R^{2a}$, $R^3$, and $R^{3a}$ are independently hydrogen or a substituted or unsubstituted alkyl group, or $R^2$ and $R^3$ or $R^{2a}$ and $R^{3a}$, together with the two carbon atoms to which they are bonded, form a substituted or unsubstituted aryl group, substituted or unsubstituted heteroaryl group, or a substituted or unsubstituted carbocyclic or heterocyclic group, $R^4$ is hydrogen or a substituted or unsubstituted alkyl group, L is a substituted or unsubstituted alkylene group, L' is a divalent substituted or unsubstituted linking group, n is 0 or 1, r, s, t, and u are independently 0 or 1 provided that one of r and s is 0 if the carbon atom to which $R^2$ and $R^{2a}$ are bonded is part of —C=C— double bond, and further provided that one of t and u is 0 if the carbon atom to which $R^3$ and $R^{3a}$ are bonded is part of a double bond, and the dotted line in Structure II indicates that a double bond may or may not be present, wherein the (a) pendant groups are present in an amount of at least 0.5 mmol/g of the polymeric binder and up to and including 7 mmol/g of the polymeric binder and the (b) pendant groups are present in an amount of at least 0.5 mmol/g of the polymeric binder and up to and including 7 mmol/g of the polymeric binder.

2. The negative-working lithographic printing plate precursor of claim 1, wherein the polymeric binder comprises a polyurethane backbone, polyester backbone, polyamide backbone, polyvinyl acetal backbone, or a polyacrylic backbone.

3. The negative-working lithographic printing plate precursor of claim 1, wherein the polymeric binder comprising a polymeric backbone having the following recurring units arranged in random order along the backbone:

same or different -A- recurring units comprising pendant groups comprising ethylenically unsaturated polymerizable groups selected from vinyl ether, vinyl amine, allyl ether, allyl amine, (meth)acryl ester, (meth)acryl amide, and aryl vinyl groups, same or different —B— recurring units represented by the following Structures (Ia), (IIa), and (IIIa):

wherein each of R and $R^1$ is independently hydrogen, cyano, a substituted or unsubstituted alkyl group, or a halogen, R', L, $R^2$, $R^{2a}$, $R^3$, $R^{3a}$, r, s, t, u, n, the dotted line, and L' are as defined for Structure (II), and optionally, same or different —C— recurring units that are different from the -A- and —B— recurring units.

4. The negative-working lithographic printing plate precursor of claim 1, wherein the (a) pendant groups are present in an amount of at least 1 mmol/g of the polymeric binder and up to and including 4 mmol/g of the polymeric binder and the (b) pendant groups are present in an amount of at least 1 mmol/g of the polymeric binder and up to and including 4 mmol/g of the polymeric binder.

5. The negative-working lithographic printing plate precursor of claim 3, wherein the polymeric binder comprises -A- recurring units in an amount of at least 30 mol % and up to and including 70 mol %, —B— recurring units in an amount of at least 20 mol % and up to and including 70 mol %, and —C— recurring units in an amount of at least 10 mol % and up to and including 40 mol %, all based on the total recurring units in the polymeric binder.

6. The negative-working lithographic printing plate precursor of claim 3, wherein the polymeric binder further comprises one or more (c) pendant groups selected from the group consisting of —C(=O)—NH$_2$, acidic and —[(CH$_2$—CR$_y$—O)]$_m$—R$_x$ groups, wherein R$_y$ and R$_x$ are independently hydrogen or methyl, and m is at least 1 and up to and including 20, and the total amount of the (c) pendant groups is at least 0.2 mmol/g of the polymeric binder and up to and including 4 mmol/g of the polymeric binder.

7. The negative-working lithographic printing plate precursor of claim 3, wherein the polymeric binder comprises:
- -A- recurring units that are derived from allyl (meth)acrylate,
- —B— recurring units represented by Structure (Ia) wherein $R^4$ is hydrogen or a substituted or unsubstituted alkyl having 1 to 4 carbon atoms, and L is methylene, and
- —C— recurring units that comprise a pendant —C(=O)—$NH_2$, acidic, or —$[(CH_2—CR_y—O)]_m$—$R_x$ group, wherein $R_y$ and $R_x$ are independently hydrogen or methyl, and m is from 1 and up to and including 20.

8. The negative-working lithographic printing plate precursor of claim 1, wherein the radiation absorber is either:
- an infrared radiation absorber that effectively absorbs infrared radiation at a wavelength of at least 700 nm and up to and including 1400 nm, or
- a sensitizer that effectively absorbs radiation at a wavelength of at least 350 nm and up to and including 450 nm.

9. The negative-working lithographic printing plate precursor of claim 1, wherein the polymeric binder comprises recurring units derived from each of allyl (meth)acrylate, an alkoxymethyl methacrylamide, and (meth)acrylic acid,
wherein:
- the recurring units derived from allyl (meth)acrylate are present in an amount of at least 0.5 mmol/g of the polymeric binder and up to and including 7 mmol/g of the polymeric binder,
- the recurring units derived from alkoxymethyl methacrylamide are present in an amount of at least 0.5 mmol/g of the polymeric polymer and up to and including 7 mmol/g of the polymeric binder, and
- the recurring units derived from (meth)acrylic acid are present in an amount of at least 0.2 mmol/g of the polymeric binder and up to and including 4 mol/g of the polymeric binder.

10. The negative-working lithographic printing plate precursor of claim 1, wherein the polymeric binder is present in the negative-working imageable layer in an amount of at least 20 weight % and up to and including 80 weight %, based on total dry weight of the negative-working imageable layer.

11. The negative-working lithographic printing plate precursor of claim 3, wherein the polymeric binder comprises -A- recurring units in an amount of at least 30 mol % and up to and including 70 mol %, —B— recurring units in an amount of at least 20 mol % and up to and including 70 mol %, and —C— recurring units in an amount of at least 10 mol % and up to and including 40 mol %, all based on the total recurring units in the polymeric binder,
- the —B— recurring units being represented by Structure (Ia), (IIa), or (IIIa) wherein:
- each of R and $R^1$ is independently hydrogen, cyano, or methyl,
- each R' is independently hydrogen, methyl, ethyl, or phenyl,
- $R^2$, $R^{2a}$, $R^3$, and $R^{3a}$ are independently hydrogen or a substituted or unsubstituted alkyl group having 1 to 6 carbon atoms, or $R^2$ and $R^3$ or $R^{2a}$ and $R^{3a}$, together with the two carbon atoms to which they are bonded, form a substituted or unsubstituted phenyl group, substituted or unsubstituted heteroaryl group, or a substituted or unsubstituted cycloalkyl group,
- $R^4$ is hydrogen or a substituted or unsubstituted alkyl group having 1 to 6 carbon atoms, and
- —C— recurring units that comprise a pendant —C(=O)—$NH_2$, acidic, or —$[(CH_2—CR_y—O)]_m$—$R_x$ group, wherein $R_y$ and $R_x$ are independently hydrogen or methyl, and m is from 1 and up to and including 20.

12. The negative-working lithographic printing plate precursor of claim 11, wherein the polymeric binder comprises -A- recurring units derived from allyl (meth)acrylate, —B— recurring units represented by Structure (Ia) wherein $R^4$ is hydrogen or a substituted or unsubstituted alkyl group having 1 to 4 carbon atoms and L is methylene, and —C— recurring units derived from (meth)acrylic acid.

13. A method for making a lithographic printing plate comprising:
- imagewise exposing the negative-working lithographic printing plate precursor of claim 1 to imaging radiation to provide exposed regions and non-exposed regions in the negative-working imageable layer, and
- developing the imagewise exposed precursor to remove the non-exposed regions of the negative-working imageable layer using a processing solution to provide a lithographic printing plate.

14. The method of claim 13, wherein negative-working lithographic printing plate precursor is sensitive to infrared radiation and the imagewise exposing is carried out using infrared radiation at a wavelength of at least 700 nm and up to and including 1400 nm.

15. The method of claim 13, wherein negative-working lithographic printing plate precursor is sensitive to radiation having a wavelength of at least 350 nm and up to and including 450 nm, and the imagewise exposing is carried out using radiation at a wavelength of at least 350 nm and up to and including 450 nm.

16. The method of claim 13, further comprising after the developing,
baking the lithographic printing plate at a temperature of at least 180° C. for at least 10 seconds.

17. The method of claim 16, wherein the developing is carried out off-press using an aqueous processing solution, followed by rinsing and gumming the lithographic printing plate prior to baking the lithographic printing plate.

18. The method of claim 13, wherein the developing is carried out off-press using an aqueous processing solution without any following rinsing and gumming the lithographic printing plate, following by
baking the lithographic printing plate at a temperature of at least 180° C. for at least 10 seconds.

19. A method for making a lithographic printing plate comprising:
- imagewise exposing the negative-working lithographic printing plate precursor of claim 11 to imaging radiation to produce exposed regions and non-exposed regions in the negative-working imageable layer,
- developing the imagewise exposed precursor to remove the non-exposed regions of the negative-working imageable layer using a processing solution to provide a lithographic printing plate, and
- optionally, after the developing, baking the lithographic printing plate at a temperature of at least 180° C. and up to and including 300° C. for at least 10 seconds and up to and including 10 minutes.

* * * * *